(12) United States Patent     (10) Patent No.:   US 12,696,619 B2

Chae et al.     (45) Date of Patent:    Jul. 28, 2026

---

(54) DISPLAY APPARATUS

(71) Applicant: SAMSUNG DISPLAY CO., LTD., Yongin-si (KR)

(72) Inventors: Jongwon Chae, Yongin-si (KR); Moosoon Ko, Yongin-si (KR); Sunghoon Moon, Yongin-si (KR); Sewan Son, Yongin-si (KR); Yongje Jeon, Yongin-si (KR); Jingoo Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/641,354

(22) Filed: Apr. 20, 2024

(65) Prior Publication Data

US 2024/0284735 A1    Aug. 22, 2024

Related U.S. Application Data

(63) Continuation of application No. 16/922,267, filed on Jul. 7, 2020, now Pat. No. 12,004,386.

(30) Foreign Application Priority Data

Oct. 25, 2019    (KR) ........................ 10-2019-0134105

(51) Int. Cl.
   *H10K 59/121*      (2023.01)
   *H10K 59/12*       (2023.01)
             (Continued)

(52) U.S. Cl.
   CPC ........... *H10K 59/121* (2023.02); *H10K 59/12* (2023.02); *H10K 77/00* (2023.02); *H10K 59/131* (2023.02); *H10K 59/1315* (2023.02);

*H10K 59/35* (2023.02); *H10K 59/65* (2023.02); *H10K 59/805* (2023.02); *H10K 59/8791* (2023.02)

(58) Field of Classification Search
None
See application file for complete search history.

(56) References Cited

U.S. PATENT DOCUMENTS

| | | | |
|---|---|---|---|
| 10,068,923 B2 | 9/2018 | Jung et al. | |
| 10,170,525 B2 | 1/2019 | Lee et al. | |

(Continued)

FOREIGN PATENT DOCUMENTS

| | | |
|---|---|---|
| CN | 107039493 A | 8/2017 |
| CN | 109509770 A | 3/2019 |

(Continued)

*Primary Examiner* — Khaja Ahmad

(74) *Attorney, Agent, or Firm* — CANTOR COLBURN LLP

(57) ABSTRACT

A display apparatus includes: a substrate including a first area and a second area, the second area including a transmission area; main pixels on the first area, each of the main pixels including a first pixel electrode, a first opposite electrode, and a first intermediate layer between the first pixel electrode and the first opposite electrode; auxiliary pixels on the second area, each of the auxiliary pixels including a second pixel electrode, a second opposite electrode, and a second intermediate layer between the second pixel electrode and the second opposite electrode; and a metal pattern layer on the second area and surrounding the transmission area.

18 Claims, 16 Drawing Sheets

(51) Int. Cl.

| | |
|---|---|
| *H10K 59/131* | (2023.01) |
| *H10K 59/35* | (2023.01) |
| *H10K 59/65* | (2023.01) |
| *H10K 59/80* | (2023.01) |
| *H10K 77/00* | (2023.01) |

(56) References Cited

U.S. PATENT DOCUMENTS

| | | | |
|---|---|---|---|
| 10,304,913 B2 | 5/2019 | Choi et al. | |
| 2005/0269942 A1 | 12/2005 | Ahn et al. | |
| 2012/0280894 A1 | 11/2012 | Park | |
| 2016/0315133 A1 | 10/2016 | Sato | |
| 2017/0064173 A1* | 3/2017 | Yoo | H04N 23/55 |
| 2017/0148856 A1 | 5/2017 | Choi et al. | |
| 2017/0162111 A1 | 6/2017 | Kang et al. | |
| 2017/0162637 A1* | 6/2017 | Choi | H10K 59/131 |
| 2017/0287992 A1* | 10/2017 | Kwak | G06F 1/1605 |
| 2017/0287994 A1 | 10/2017 | Senda et al. | |
| 2018/0143669 A1 | 5/2018 | Bok et al. | |
| 2019/0079622 A1* | 3/2019 | Choi | G06F 3/0446 |
| 2019/0081118 A1 | 3/2019 | Oh et al. | |
| 2019/0123298 A1* | 4/2019 | Kanaya | H10D 86/60 |
| 2019/0130822 A1 | 5/2019 | Jung et al. | |
| 2019/0208044 A1 | 7/2019 | Lee et al. | |
| 2019/0221782 A1 | 7/2019 | Sun et al. | |

FOREIGN PATENT DOCUMENTS

| | | | |
|---|---|---|---|
| JP | 2012234798 A | 11/2012 | |
| JP | 2016207486 A | 12/2016 | |
| KR | 1020170033965 A | 3/2017 | |
| KR | 1020170055587 A | 5/2017 | |
| KR | 1020170066767 A | 6/2017 | |
| KR | 1020170113066 A | 10/2017 | |
| KR | 1020180057796 A | 5/2018 | |
| KR | 1020190028245 A | 3/2019 | |

* cited by examiner

DISPLAY APPARATUS

This application is a continuation of U.S. application Ser. No. 16/922,267, filed on Jul. 7, 2020, which claims priority to Korean Patent Application No. 10-2019-0134105, filed on Oct. 25, 2019, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus with improved reliability.

2. Description of Related Art

Display apparatuses have been used for various purposes. Also, since the thickness and weight of display apparatuses have been reduced, the range of use of display apparatuses has increased.

According to the various uses of display apparatuses, different methods of designing shapes of display apparatuses have been developed, and more functions have been embedded in or linked to display apparatuses.

SUMMARY

One or more embodiments include a display apparatus including an area in which a sensor, etc. may be arranged in a display area. However, the above technical features are exemplary and the scope of the disclosure is not limited thereto.

According to an embodiment of the invention, a display apparatus includes a substrate including a first area and a second area, where the second area includes a transmission area, main pixels on the first area, where each of the main pixels includes a first pixel electrode, a first opposite electrode, and a first intermediate layer between the first pixel electrode and the first opposite electrode, auxiliary pixels on the second area, where each of the auxiliary pixels includes a second pixel electrode, a second opposite electrode, and a second intermediate layer between the second pixel electrode and the second opposite electrode, and a metal pattern layer on the second area and surrounding the transmission area.

In an embodiment, the display apparatus may further include a first conductive layer on the substrate, an interlayer insulating layer on the first conductive layer, and a second conductive layer on the interlayer insulating layer.

In an embodiment, the metal pattern layer may be integrally provided with the second conductive layer as a single unitary unit.

In an embodiment, the metal pattern layer and the second pixel electrode may at least partially overlap each other.

In an embodiment, the second conductive layer may include a driving voltage line.

In an embodiment, the metal pattern layer may be integrally provided with the first conductive layer as a single unitary unit.

In an embodiment, the metal pattern layer and the second pixel electrode may at least partially overlap each other.

In an embodiment, the metal pattern layer and the first conductive layer may be spaced apart from each other in a same layer.

In an embodiment, the metal pattern layer may be electrically connected to the second conductive layer via a first contact hole defined in the interlayer insulating layer.

In an embodiment, the metal pattern layer may be integrally provided with the second pixel electrode as a single unitary unit.

In an embodiment, the metal pattern layer may at least partially overlap the first conductive layer and the second conductive layer.

In an embodiment, the display apparatus may further include a third pixel electrode on the first area and spaced apart from the first pixel electrode, and a fourth pixel electrode on the second area and spaced apart from the second pixel electrode.

In an embodiment, a first distance may be defined as a shortest distance from the first pixel electrode to the third pixel electrode, the second distance may be defined as a shortest distance from the second pixel electrode to the fourth pixel electrode, and the first distance may be greater than the second distance.

In an embodiment, the transmission area may have a circular shape or an elliptical shape.

According to an embodiment of the invention, a display apparatus includes a substrate including a first area and a second area, where the second area includes a transmission area, first main pixels on the first area, where each of the first main pixels includes a first pixel electrode, a first opposite electrode, and a first intermediate layer between the first pixel electrode and the first opposite electrode, first auxiliary pixels on the second area, where each of the first auxiliary pixels includes a second pixel electrode, a second opposite electrode, and a second intermediate layer between the second pixel electrode and the second opposite electrode, a metal pattern layer on the second area, the metal pattern layer surrounding the transmission area, and a component under the substrate and corresponding to the second area, where the component includes an electronic element which emits or receives light.

In an embodiment, the display apparatus may further include a first conductive layer on the substrate, an interlayer insulating layer on the first conductive layer, and a second conductive layer on the interlayer insulating layer.

In an embodiment, the metal pattern layer and the second pixel electrode may at least partially overlap each other.

In an embodiment, the metal pattern layer may be integrally provided with the second conductive layer as a single unitary unit.

In an embodiment, the metal pattern layer may be integrally provided with the first conductive layer as a single unitary unit.

In an embodiment, the metal pattern layer may be integrally provided with the second pixel electrode as a single unitary unit.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
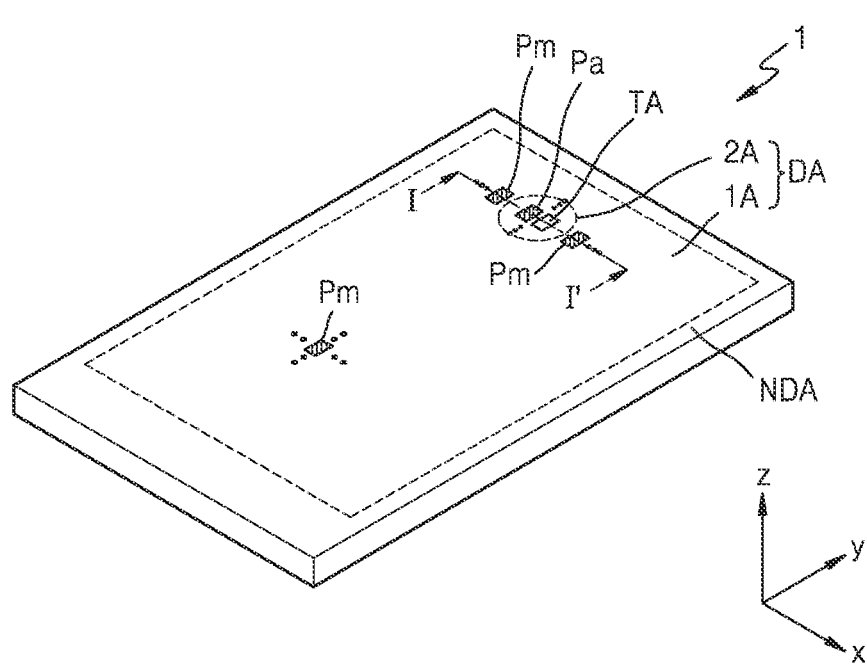
FIG. 1 is a perspective view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Sizes of components in the drawings may be exaggerated for convenience of explanation. In other words, since sizes and thicknesses of components in the drawings are arbitrarily illustrated for convenience of explanation, the following embodiments are not limited thereto.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Hereinafter, embodiments of the invention will be described in detail with reference to the accompanying drawings.

FIG. 1 is a perspective view of a display apparatus 1 according to an embodiment.

Referring to FIG. 1, an embodiment of the display apparatus 1 includes a display area DA and a non-display area NDA, in which the display area DA displays images and the non-display area NDA does not display images. The display area DA includes a first area 1A and a second area 2A including a transmission area TA. The display apparatus 1 may provide a main image by using light emitted from a plurality of main pixels Pm in the first area 1A and may provide an auxiliary image by using light emitted from a plurality of auxiliary pixels Pa in the second area 2A.

The second area 2A may be an area below which a component including an optical sensor, etc. is arranged, as described later with reference to FIG. 2. The second area 2A may include the transmission area TA, through which light and/or sound output from the component to outside or proceeding from outside to the component may transmit. In an embodiment, when infrared ray transmits through the second area 2A, a light transmittance may be about 30% or greater, for example, 50% or greater, 75% or greater, 80% or greater, 85% or greater, or 90% or greater.

In such an embodiment, the plurality of auxiliary pixels Pa may be in the second area 2A, and a predetermined image may be provided by using light emitted from the plurality of auxiliary pixels Pa. The image provided from the second area 2A is an auxiliary image having a resolution less than that of an image provided by the first area 1A. In such an embodiment, the second area 2A includes the transmission area TA, through which the light and/or sound may transmit, and thus the number of the auxiliary pixels Pa per unit area may be less than that of the main pixels Pm per unit area in the first area 1A.

Hereinafter, for convenience of description, embodiments where the display apparatus 1 is an organic light-emitting display apparatus will be described in detail, but embodiments of the display apparatus 1 are not limited thereto. In an alternative embodiment, the display apparatus 1 may be one of various types of display apparatus, e.g., an inorganic light-emitting display, a quantum dot light-emitting display, etc.

Referring to FIG. 1, the second area 2A on the display area DA may have a rectangular shape, but is not limited thereto. Alternatively, the display area DA may have a circular shape, an ellipse shape, or a polygonal shape such as a triangle, etc., and a location and the number of the second area 2A may be variously modified.

Figure 2:
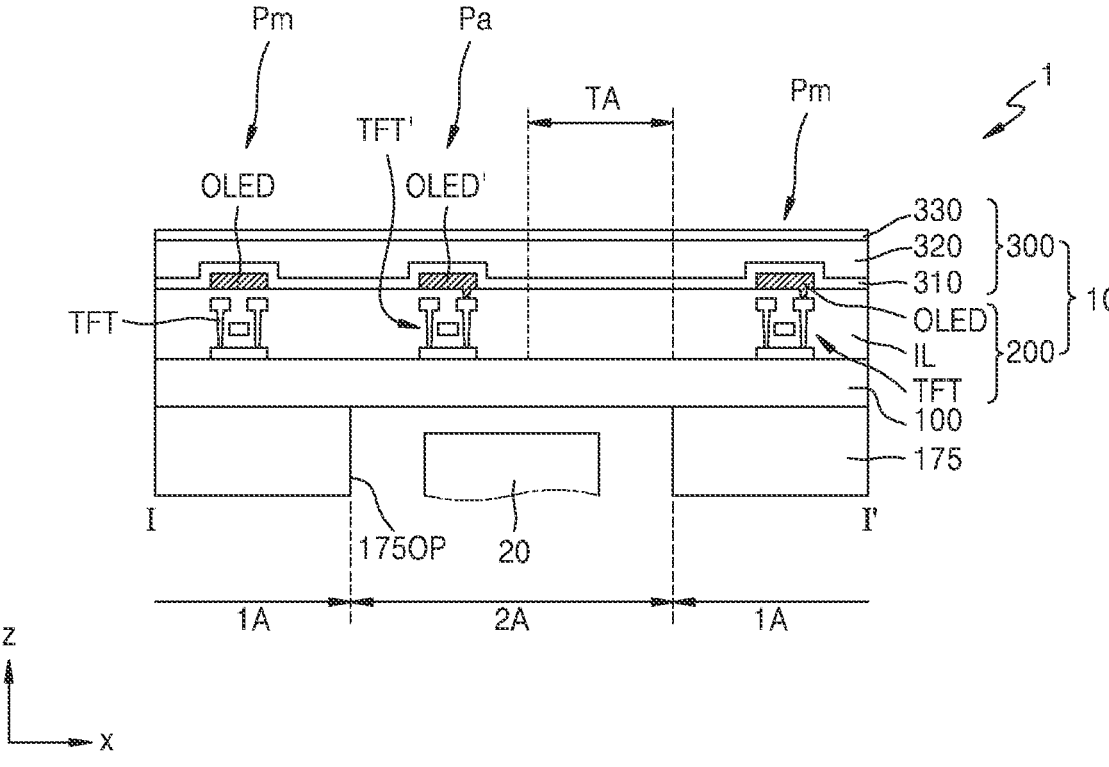
FIG. 2 is a cross-sectional view of a display apparatus according to an embodiment.

FIG. 2 is a cross-sectional view of the display apparatus 1 according to an embodiment.

Referring to FIG. 2, an embodiment of the display apparatus 1 may include a display panel 10 including a display element and a component 20 under the display panel 10 to correspond to the second area 2A.

The display panel 10 may include a substrate 100, a display element layer 200 on the substrate 100, and a thin film encapsulation layer 300 that is an encapsulation member for sealing the display element layer 200. In an embodiment, the display panel 10 may further include a lower protective film 175 under the substrate 100.

The substrate 100 may include a glass or a polymer resin. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, etc. The substrate 100 including the polymer resin may be flexible, rollable, or bendable. The substrate 100 may have a multilayered structure including a layer including the polymer resin and an inorganic layer (not shown).

The display element layer 200 may include a circuit layer including main and auxiliary thin film transistors TFT and TFT', main and auxiliary organic light-emitting diodes OLED and OLED' as display elements, and an insulating layer IL between the thin film transistors TFT and TFT' and the organic light-emitting diodes OLED and OLED'. The main pixels Pm each including the main thin film transistor TFT and the main organic light-emitting diode OLED connected to the main thin film transistor TFT may be in the first area 1A, and the auxiliary pixels Pa each including the auxiliary thin film transistor TFT' and the auxiliary organic light-emitting diode OLED' connected to the auxiliary thin film transistor TFT' may be in the second area 2A.

In an embodiment, the transmission area TA, in which the auxiliary thin film transistor TFT' and display elements are not arranged, may be in the second area 2A. The transmission area TA may be understood as an area, through which light/signals emitted from the component 20 or light/signals incident to the component 20 transmit.

The component 20 may be in the second area 2A. The component 20 may include an electronic element using light or sound. In one embodiment, for example, the component 20 may include an optical device, a sensor for receiving light, e.g., an infrared ray sensor, a sensor for outputting and sensing light or sound to measure a distance or to sense fingerprints, etc., a small-sized lamp that emits light, or a speaker for outputting sound.

The thin film encapsulation layer 300 may include an inorganic encapsulation layer and an organic encapsulation layer. In an embodiment, referring to FIG. 2, the thin film encapsulation layer 300 may include first and second inorganic encapsulation layers 310 and 330, and an organic encapsulation layer 320 between the first and second inorganic encapsulation layers 310 and 330.

The first and second inorganic encapsulation layers 310 and 330 may include at least one inorganic insulating materials selected from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, polyethylene, etc.

The lower protective film 175 is adhered to a lower portion of the substrate 100 to protect and support the substrate 100. An opening 1750P may be defined through the lower protective film 175 to correspond to the second area 2A. In such an embodiment where the opening 1750P is defined through the lower protective film 175 includes, a light transmittance of the second area 2A may be improved. The lower protective film 175 may include polyethylene terephthalate or polyimide.

An area of the second area 2A may be greater than that of a region where the component 20 is arranged. Accordingly, an area of the opening 1750P in the lower protective film 175 may not be equal to that of the second area 2A. In one embodiment, for example, the area of the opening 1750P may be less than that of the second area 2A.

In an embodiment, a plurality of components 20 may be in the second area 2A. The plurality of components 20 may have different functions from one another.

Although not shown in the drawings, elements such as an input sensing member for sensing a touch input, an anti-reflection member including a polarizer and a retarder, or a color filter and a black matrix, a transparent window, etc. may be further on the display panel 10.

In an embodiment, the thin film encapsulation layer 300 is used as an encapsulation member for sealing the display element layer 200, but one or more embodiments are not limited thereto. In one alternative embodiment, for example, an encapsulation substrate that is bonded to the substrate 100 via a sealant or a frit may be used as the member for encapsulating the display element layer 200.

Figure 3:
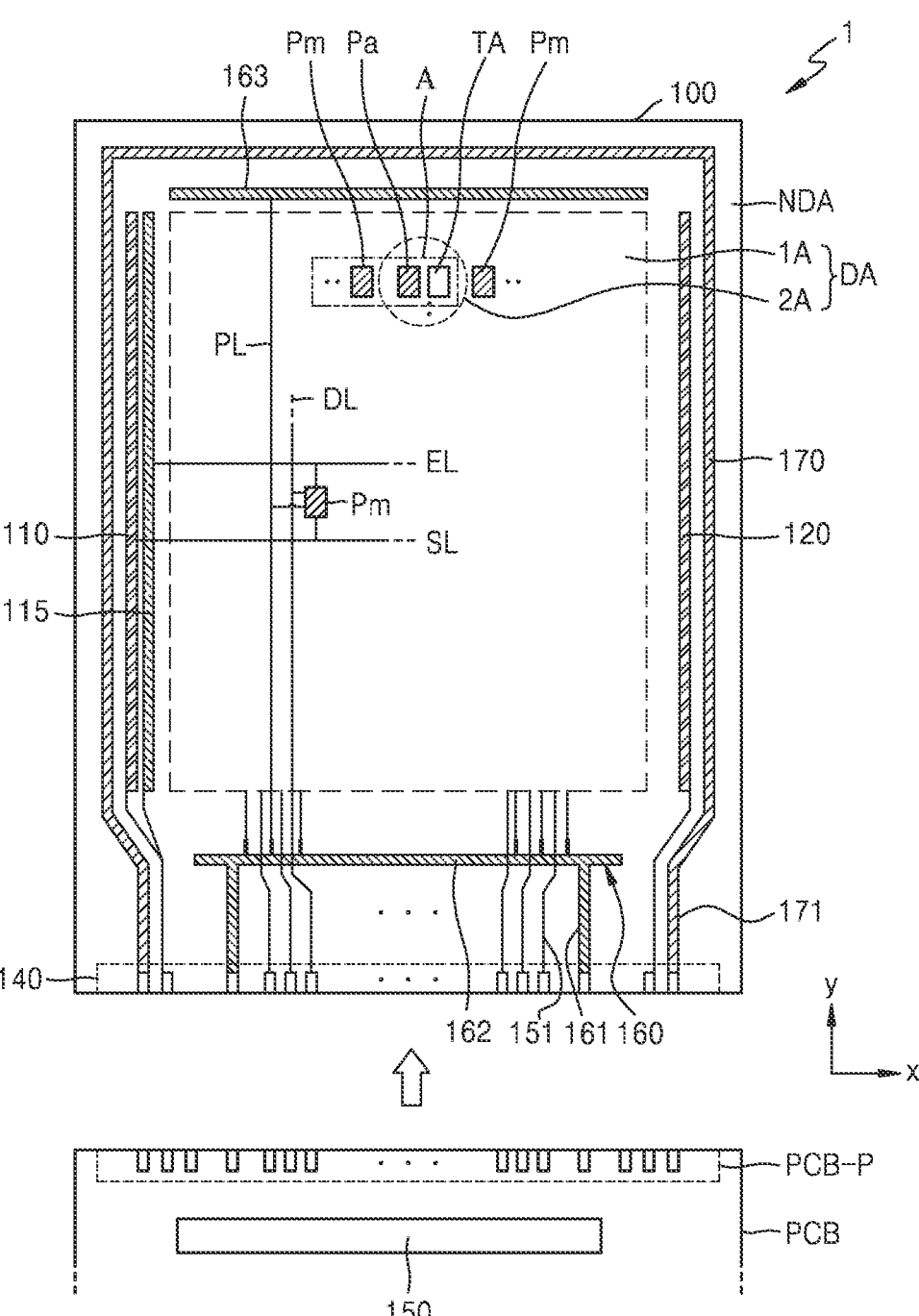
FIG. 3 is a plan view of a display apparatus according to an embodiment.

FIG. 3 is a plan view of the display apparatus 1 according to an embodiment.

Referring to FIG. 3, various elements of the display apparatus 1 are on the substrate 100. The substrate 100 includes the display area DA and the non-display area NDA surrounding the display area DA. The display area DA includes the first area 1A and the second area 2A. The display area DA is covered by the encapsulation member described above with reference to FIG. 2, to protect elements on the substrate 100 from external air or moisture.

The display apparatus 1 may include a plurality of main pixels Pm in the first area 1A. Each of the main pixels Pm may include a display element such as an organic light-emitting diode. Each of the main pixels Pm may emit light, e.g., red light, green light, blue light, or white light, via the organic light-emitting diode. Herein, the main pixel Pm may be understood as a pixel emitting red light, green light, blue light, or white light, as described above.

The second area 2A may be at a side of the first area 1A, and a plurality of auxiliary pixels Pa are in the second area 2A. Each of the auxiliary pixels Pa may include a display element such as an organic light-emitting diode. Each of the auxiliary pixels Pa may emit light, e.g., red light, green light, blue light, or white light, via the organic light-emitting diode. Herein, the auxiliary pixel Pa may be understood as a pixel emitting red light, green light, blue light, or white light, as described above. The second area 2A may include the transmission area TA between the auxiliary pixels Pa. A component 20 (see FIG. 2) may be under the second area 2A of the display apparatus 1.

In an embodiment, each main pixel Pm and each auxiliary pixel Pa may include a same pixel circuit as each other. However, one or more embodiments are not limited thereto. Alternatively, the pixel circuit included in the main pixel Pm and the pixel circuit included in the auxiliary pixel Pa may be different from each other.

Since the second area 2A includes the transmission area TA, a resolution of the second area 2A may be less than that of the first area 1A. In one embodiment, for example, the resolution of the second area 2A may be half the resolution of the first area 1A. In some embodiments, the resolution of the first area 1A may be 400 pixel per inch (ppi) or greater, and the resolution of the second area 2A may be about 200 ppi.

Each of the main and auxiliary pixels Pm and Pa may be electrically connected to external circuits in the non-display area NDA. A first scan driving circuit 110, a first emission driving circuit 115, a second scan driving circuit 120, a terminal 140, a data driving circuit 150, a first power supply line 160, and a second power supply line 170 may be in the non-display area NDA.

The first scan driving circuit 110 may provide each of the main and auxiliary pixels Pm and Pa with a scan signal via a scan line SL. The first emission driving circuit 115 may provide each of the pixels P with an emission control signal via an emission control line EL. The second scan driving circuit 120 may be arranged in parallel with the first scan driving circuit 110 with the display area DA therebetween. Some of the main and auxiliary pixels Pm and Pa in the display area DA may be electrically connected to the first scan driving circuit 110, and the remaining of the main and auxiliary pixels Pm and Pa may be connected to the second scan driving circuit 120. In an embodiment, a second emission driving circuit (not shown) may be in parallel with the first emission driving circuit 115 with the display area DA therebetween.

The first emission driving circuit 115 is spaced apart from the first scan driving circuit 110 in an X-direction on the non-display area NDA. In an alternative embodiment, the first emission driving circuit 115 and the first scan driving circuit 110 may be alternately arranged in a Y-direction.

The terminal 140 may be at a side of the substrate 100. The terminal 140 may not be covered by an insulating layer, but is exposed and may be electrically connected to a printed circuit board PCB. A terminal PCB-P of the printed circuit board PCB may be electrically connected to the terminal 140 of the display apparatus 1. The printed circuit board PCB may be configured to transfer a signal or power from a controller (not shown) to the display apparatus 1. A control signal generated by a controller may be respectively transferred to the first and second scan driving circuits 110 and 120 and the first emission driving circuit 115 via the printed circuit board PCB. The controller may provide the first and second power supply lines 160 and 170 respectively with a first power voltage and a second power voltage via first and second connecting lines 161 and 171. A first power voltage ELVDD is supplied to each of the main and auxiliary pixels Pm and Pa via a driving voltage line PL connected to the first power supply line 160, and a second power voltage ELVSS may be provided to an opposite electrode of each of the main and auxiliary pixels Pm and Pa connected to the second power supply line 170.

The data driving circuit 150 is electrically connected to a data line DL. A data signal of the data driving circuit 150 may be provided to each of the main and auxiliary pixels Pm and Pa via a connecting line 151 connected to the terminal 140 and the data line DL connected to the connecting line 151. In an embodiment, as shown in FIG. 3, the data driving circuit 150 may be on the printed circuit board PCB, but not being limited thereto. Alternatively, the data driving circuit 150 may be on the substrate 100. In one embodiment, for example, the data driving circuit 150 may be between the terminal 140 and the first power supply line 160.

The first power supply line 160 may include a first sub-line 162 and a second sub-line 163 that extend in parallel with each other in an X-direction with the display area DA therebetween. The second power supply line 170 has a loop shape with an open side and may partially surround the display area DA.

Figure 4:
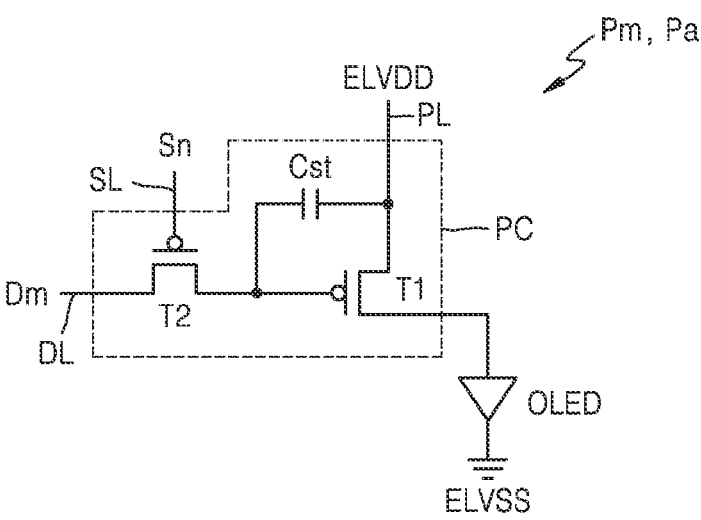
FIGS. 4 and 5 are equivalent circuit diagrams of a pixel included in a display apparatus according to an embodiment.
Figure 5:
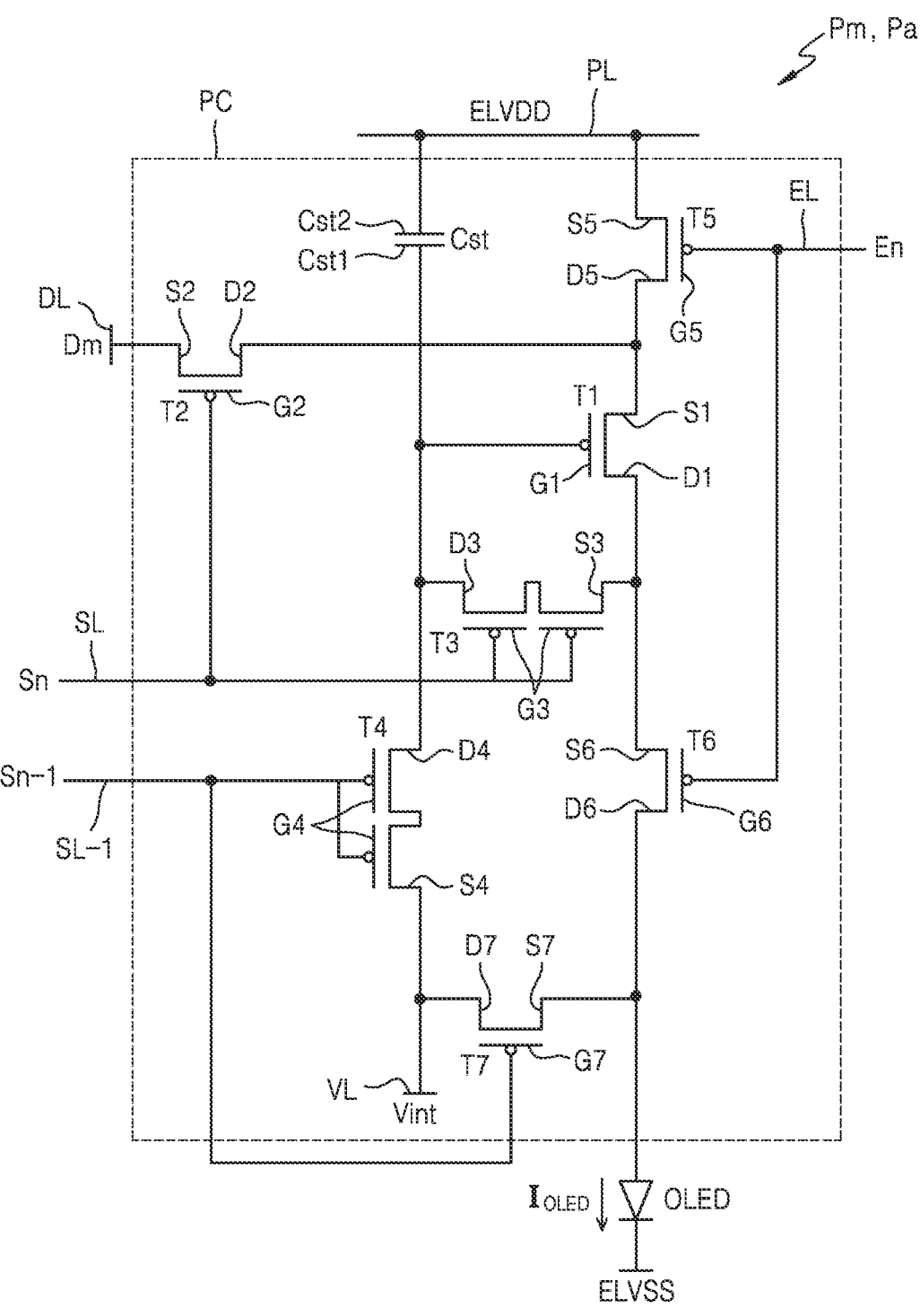

FIGS. 4 and 5 are equivalent circuit diagrams of a pixel Pm or Pa included in the display apparatus 1 according to an embodiment.

Referring to FIG. 4, an embodiment of each pixel Pm or Pa includes a pixel circuit PC connected to the scan line SL and the data line DL, and an organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and is configured to transfer a data signal Dm input through the data line DL to the driving thin film transistor T1 in response to a scan signal Sn input through the scan line SL.

The storage capacitor Cst is connected to the switching thin film transistor T2 and the driving voltage line PL and stores a voltage corresponding to a difference between a voltage transferred from the switching thin film transistor T2 and the first power voltage ELVDD (or a driving voltage) supplied to the driving voltage line PL.

The driving thin film transistor T1 is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a predetermined luminance corresponding to the driving current.

FIG. 4 shows an embodiment in which the pixel circuit PC includes two thin film transistors and a single storage capacitor, but one or more embodiments are not limited thereto. Alternatively, as shown in FIG. 5, the pixel circuit PC may include seven thin film transistors and a single storage capacitor.

Referring to FIG. 5, each pixel Pm or Pa includes the pixel circuit PC and the organic light-emitting diode OLED connected to the pixel circuit PC. The pixel circuit PC may include a plurality of thin film transistors and a storage capacitor. The thin film transistors and the storage capacitor may be connected to signal lines SL, SL-1, EL, and DL, an initialization voltage line VL, and a driving voltage line PL.

In an embodiment, as shown in FIG. 5, each pixel Pm or Pa is connected to the signal lines SL, SL-1, EL, and DL, the initialization voltage line VL, and the driving voltage line PL, but one or more embodiments are not limited thereto. In an embodiment, at least one of the signal lines SL, SL-1, EL, and DL, the initialization voltage line VL, and the lower driving voltage line PL may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL for transferring a scan signal Sn, a previous scan line SL-1 for transferring a previous scan signal Sn-1 to the first initialization thin film transistor T4 and the second initialization thin film transistor T7, an emission control line EL for transferring an emission control signal En to the operation control thin film transistor T5 and the emission control thin film transistor T6, and a data line DL that intersects with the scan line SL and is configured to transfer a data signal Dm. The driving voltage line PL is configured to transfer the driving voltage ELVDD to the driving thin film transistor T1, and the initialization voltage line VL is configured to transfer an initialization voltage Vint for initializing the driving thin film transistor T1 and the pixel electrode.

A driving gate electrode G1 of the driving thin film transistor T1 is connected to a first storage capacitor plate Cst1 of the storage capacitor Cst, a driving source electrode S1 of the driving thin film transistor T1 is connected to the driving voltage line PL via the operation control thin film transistor T5, and a driving drain electrode D1 of the driving thin film transistor T1 is electrically connected to the pixel electrode of the organic light-emitting diode OLED via the emission control thin film transistor T6. The driving thin film transistor T1 receives the data signal Dm based on a switching operation of the switching thin film transistor T2 to supply a driving current IOLED to the organic light-emitting diode OLED.

A switching gate electrode G2 of the switching thin-film transistor T2 is connected to the scan line SL, a switching source electrode S2 of the switching thin film transistor T2 is connected to the data line DL, a switching drain electrode D2 of the switching thin film transistor T2 is connected to the driving source electrode S1 of the driving thin film transistor T1 and at the same time, is connected to the lower driving voltage line PL via the operation control thin film transistor T5. The switching thin film transistor T2 is turned on in response to the scan signal Sn received through the scan line SL and performs a switching operation for transferring the data signal Dm transferred through the data line DL to the driving source electrode S1 of the driving thin film transistor T1.

A compensation gate electrode G3 of the compensation thin film transistor T3 is connected to the scan line SL, a compensation source electrode S3 of the compensation thin film transistor T3 is connected to the driving drain electrode D1 of the driving thin film transistor T1 and at the same time is connected to the pixel electrode of the organic light-emitting diode OLED via the emission control thin film transistor T6, and a compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to the scan signal Sn received through the scan line SL to electrically connect the driving gate electrode G1 and the driving drain electrode D1 of the driving thin film transistor T1 to each other and to diode-connect the driving thin film transistor T1.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL, and the first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode GE1 of the driving thin film transistor T1. The first initialization thin film transistor T4 is turned on in response to a previous scan signal Sn-1 transferred through the previous scan line SL-1 to transfer the initialization voltage Vint to the driving gate electrode G1 of the driving thin film transistor T1 and perform an initialization operation for initializing a voltage at the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the lower driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is electrically connected to a second initialization source electrode S7 of the second initialization thin film transistor T7 and the pixel electrode of the organic light-emitting diode OLED.

The operation control thin film transistor T5 and the emission control thin film transistor T6 are simultaneously turned on in response to the emission control signal En transferred through the emission control line EL, and are configured to transfer the driving voltage ELVDD to the organic light-emitting diode OLED and to allow the driving current IOLED to flow in the organic light-emitting diode OLED.

The second initialization gate electrode G7 of the second initialization thin film transistor T7 is connected to the previous scan line SL-1, a second initialization source electrode S7 of the second initialization thin film transistor T7 is connected to the emission control drain electrode D6 of the emission control thin film transistor T6 and the pixel electrode of the organic light-emitting diode OLED, and a second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to the previous scan signal Sn-1 transferred through the previous scan line SL-1 to initialize the pixel electrode of the organic light-emitting diode OLED.

FIG. 5 shows an embodiment in which the first initialization thin film transistor T4 and the second initialization thin film transistor T7 are connected to the previous scan line SL-1, but one or more embodiments are not limited thereto. In an alternative embodiment, the first initialization thin film transistor T4 may be connected to the previous scan line SL-1 to operate based on the previous scan signal Sn-1, and the second initialization thin film transistor T7 may be connected to a separate signal line (e.g., a post scan line) to operate based on a signal transferred to the separate signal line.

A second storage capacitor plate Cst2 of the storage capacitor Cst is connected to the driving voltage line PL, and an opposite electrode of the organic light-emitting diode OLED is connected to the common voltage ELVSS. Accordingly, the organic light-emitting diode OLED emits light by receiving the driving current IOLED from the driving thin film transistor T1 to display images.

In an embodiment, as shown in FIG. 5, the compensation thin film transistor T3 and the first initialization thin film transistor T4 have dual-gate electrodes, but not being limited thereto. Alternatively, the compensation thin film transistor T3 and the first initialization thin film transistor T4 may each have a single gate electrode.

In an embodiment, the main pixel Pm and the auxiliary pixel Pa may include a same pixel circuits PC as each other. However, one or more embodiments are not limited thereto. The main pixel Pm and the auxiliary pixel Pa may have pixel circuits PC of different structures. In one embodiment, for example, the main pixel Pm adopts the pixel circuit shown in FIG. 5 and the auxiliary pixel Pa may adopt the pixel circuit shown in FIG. 4.

Figure 6:
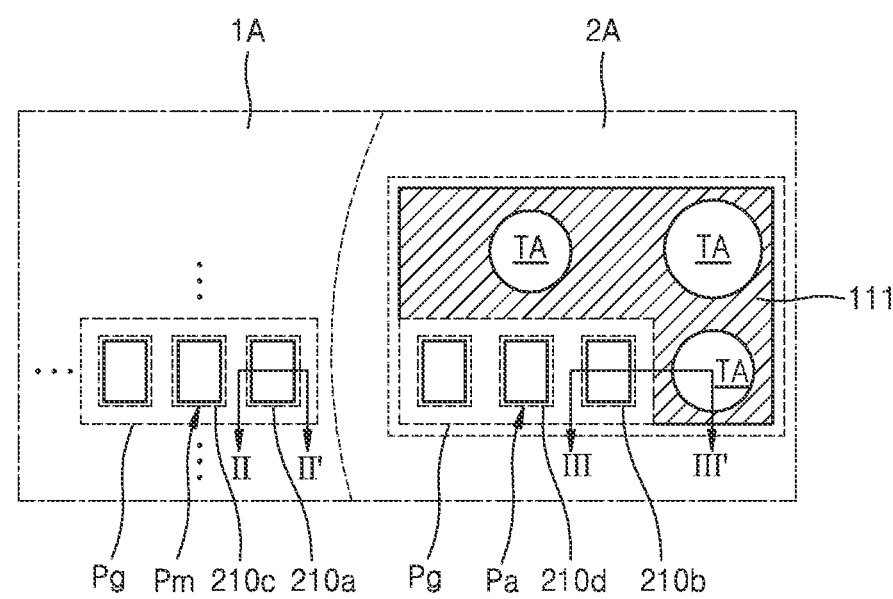
FIG. 6 is an enlarged view of portion A in FIG. 3.
Figure 6:
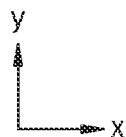

FIG. 6 is an enlarged view of portion A in FIG. 3. As described later with reference to FIGS. 7A to 7D, an interlayer insulating layer 107, a planarization layer 113, a pixel defining layer 180, a second opposite electrode 230*b*, etc. may be on a metal pattern layer 111 of FIG. 6, but the above layers are omitted in FIG. 6 for convenience of illustration and description.

Referring to FIG. 6, an embodiment of the display apparatus 1 includes the substrate 100 including the first area 1A and the second area 2A including the transmission area TA, the main pixels Pm in the first area 1A, the auxiliary pixels Pa in the second area 2A, and the metal pattern layer 111 on the second area 2A to surround the transmission area TA. In such an embodiment, each of the main pixels Pm includes a first pixel electrode 210*a*, a first opposite electrode 230*a*, a first intermediate layer between the first pixel electrode 210*a* and the first opposite electrode 230*a*, and each of the auxiliary pixels Pa includes a second pixel electrode 210*b*, a second opposite electrode, and a second intermediate layer between the second pixel electrode 210*b* and the second opposite electrode. A third pixel electrode 210*c* may be on the first area 1A to be spaced apart from the first pixel electrode 210*a*, and a fourth pixel electrode 210*d* may be on the second area 2A to be spaced apart from the second pixel electrode 210*b*.

Pixel groups Pg may be in the first area 1A and the second area 2A. Each pixel group Pg may include at least one pixel Pm or Pa. In an embodiment, as shown in FIG. 6, one pixel group Pg includes three pixels Pm or Pa arranged in one column. However, one or more embodiments are not limited thereto. The number of the pixels Pm or Pa and arrangement of the pixels Pm or Pa in one pixel group Pg may be variously modified. In one embodiment, for example, one pixel group Pg may include fourth pixels Pm or Pa arranged in two columns or eight pixels Pm or Pa arranged in four columns. Herein, the pixel Pm or Pa may emit red light, green light, blue light, or white light.

The transmission area TA has a high light transmittance because a display element is not arranged, and a plurality of transmission areas TA may be included in the second area 2A. The transmission area TA may surround the pixel group Pg. Alternatively, the transmission area TA may be alternately arranged with the pixel group Pg in the X-direction and/or Y-direction. The metal pattern layer 111 is not in the transmission area TA, and the transmission area TA may denote a region of the second area 2A, in which the region corresponds to an opening in the metal pattern layer 111. In an embodiment, the transmission area TA may have a circular shape or an elliptical shape.

A size of the transmission area TA may be at least greater than a light emission area of one pixel Pm or Pa. In an embodiment, the size of the transmission area TA may be equal to or greater than that of one pixel group Pg. In an embodiment, a plurality of transmission areas TA may be provided, and the transmission areas TA may have different sizes from each other.

FIGS. 7A to 7D are cross-sectional views of a display apparatus according to an embodiment.

Hereinafter, a stack structure of embodiments of the display apparatus will be described below with reference to FIGS. 7A to 7D. FIGS. 7A to 7D are cross-sectional views of the first area 1A and the second area 2A taken along line II-II' and III-III' of FIG. 6.

Figure 7A:
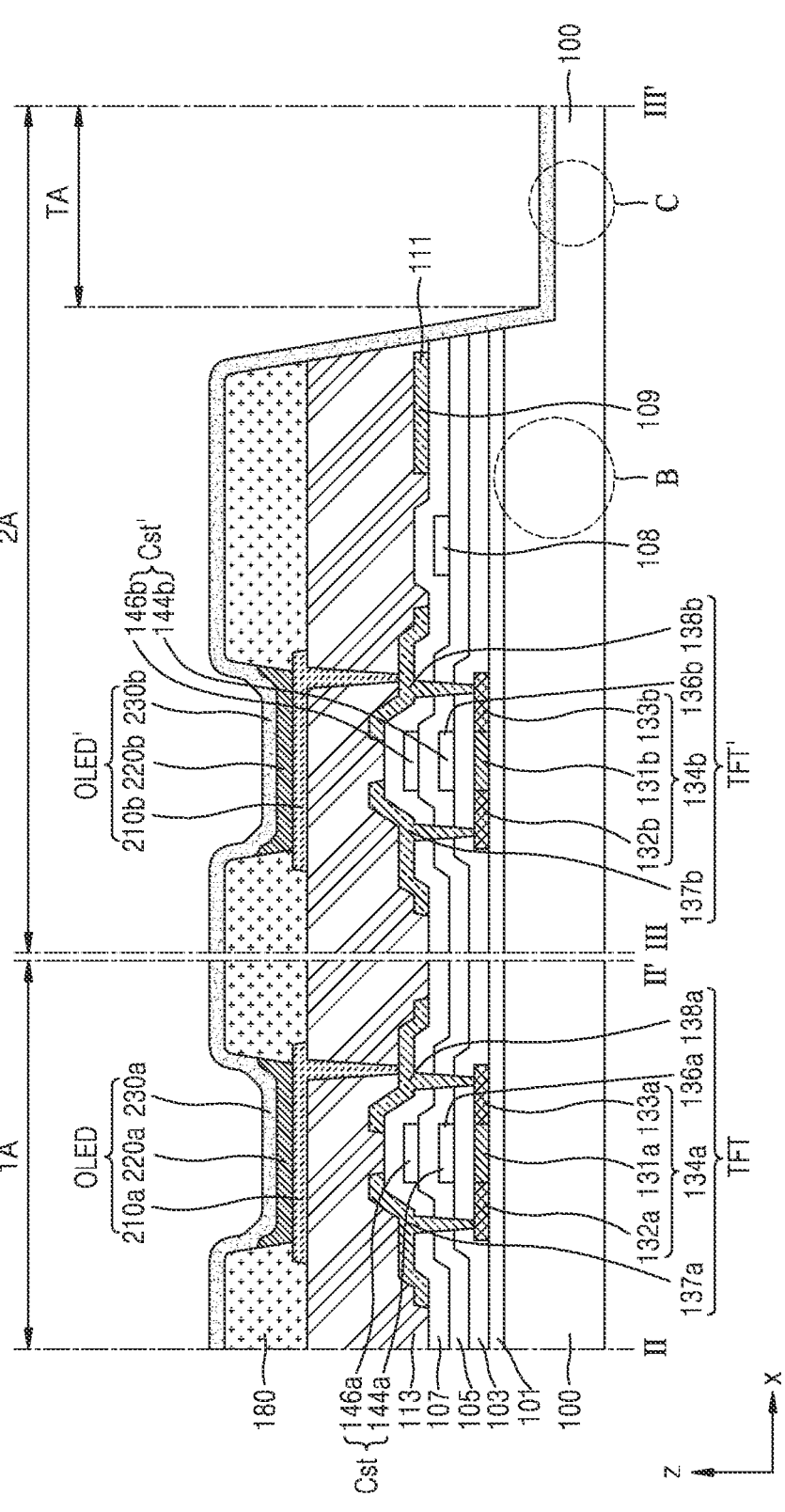
FIGS. 7A to 7D are cross-sectional views of a display apparatus according to an embodiment.

Referring to FIG. 7A, an embodiment of the display apparatus includes the first area 1A and the second area 2A. The main pixels Pm are in the first area 1A and the auxiliary pixels Pa and the transmission area TA are in the second area 2A.

Each of the main pixels Pm may include the main thin film transistor TFT, a main storage capacitor Cst, and the main organic light-emitting diode OLED. Each of the auxiliary pixels Pa may include the auxiliary thin film transistor TFT', an auxiliary storage capacitor Cst', and the auxiliary organic light-emitting diode OLED'.

Hereinafter, a structure an embodiment in which elements included in the display apparatus are laminated will be described in detail.

The substrate 100 may include a glass or a polymer resin. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, etc. The substrate 100 including the polymer resin may be flexible, rollable, or bendable. The substrate 100 may have a multilayered structure including a layer including the polymer resin and an inorganic layer (not shown).

A buffer layer 101 is on the substrate 100 to reduce or block infiltration of impurities, moisture, or external air from a lower portion of the substrate 100, and to provide a flat surface on the substrate 100. The buffer layer 101 may include an inorganic material, such as an oxide material or a nitride material, an organic material, or an inorganic-organic composite material, and may have a single-layered or multi-layered structure including the inorganic material and the organic material. A barrier layer (not shown) for preventing infiltration of external air may be further provided between the substrate 100 and the buffer layer 101.

The main thin film transistor TFT and the auxiliary thin film transistor TFT' may be on the buffer layer 101. The main thin film transistor TFT includes a first semiconductor layer 134a, a first gate electrode 136a, a first source electrode 137a, and a first drain electrode 138a, and the auxiliary thin film transistor TFT' includes a second semiconductor layer 134b, a second gate electrode 136b, a second source electrode 137b, and a second drain electrode 138b. The main thin film transistor TFT is connected to the main organic light-emitting diode OLED of the first area 1A to drive the main organic light-emitting diode OLED. The auxiliary thin film transistor TFT' is connected to the auxiliary organic light-emitting diode OLED' of the second area 2A to drive the auxiliary thin film transistor OLED'.

The first semiconductor layer 134a and the second semiconductor layer 134b are on the buffer layer 101, and may respectively include first and second channel regions 131a and 131b that respectively overlap the first gate electrode 136a and the second gate electrode 136b, and first and second source regions 132a and 132b and first and second drain regions 133a and 133b at opposite sides of the first and second channel regions 131a and 131b and including impurities of higher concentration than those of the first and second channel regions 131a and 131b. Here, the impurities may include N-type impurities or P-type impurities. The first and second source regions 132a and 132b and the first and second drain regions 133a and 133b may be electrically connected to first and second source electrodes 137a and 137b and first and second drain electrodes 138a and 138b of the main and auxiliary thin film transistors TFT and TFT', respectively.

The first semiconductor layer 134a and the second semiconductor layer 134b may include an oxide semiconductor and/or a silicon semiconductor. In an embodiment, where the first semiconductor layer 134a and the second semiconductor layer 134b include an oxide semiconductor, for example, the first and second semiconductor layers 134a and 134b may include an oxide material of at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). In one embodiment, for example, the first semiconductor layer 134a and the second semiconductor layer 134b may include at least one selected from InSnZnO ("ITZO") and InGaZnO ("IGZO"), for example. In an embodiment, where the first semiconductor layer 134a and the second semiconductor layer 134b include silicon semiconductor, the first and second semiconductor layers 134a and 134b may include, for example, amorphous silicon ("a-Si") or low temperature poly-silicon ("LTPS") that is obtained by crystallizing the a-Si.

The first gate electrode 136a and the second gate electrode 136b may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu). The first gate electrode 136a and the second gate electrode 136b may be connected to a gate line applying electrical signals to the first gate electrode 136a and the second gate electrode 136b.

The first gate insulating layer 103 may be between the first semiconductor layer 134a and the first gate electrode 136a and between the second semiconductor layer 134b and the second gate electrode 136b. The first gate insulating layer 103 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 103 may have a single-layered or a multi-layered structure including the inorganic insulating material.

The second gate insulating layer 105 may cover the first gate electrode 136a and the second gate electrode 136b. The second gate insulating layer 105 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 105 may have a single-layered or a multi-layered structure including the inorganic insulating material.

The main storage capacitor Cst and the auxiliary storage capacitor Cst' may be on the second gate insulating layer 105. The main storage capacitor Cst may include a first lower electrode 144a and a first upper electrode 136a. In addition, the main storage capacitor Cst may overlap the main thin film transistor TFT, and the first lower electrode 144a of the main storage capacitor Cst may be integrally provided with the first gate electrode 136a of the main thin film transistor TFT as a single unitary unit. In an alternative embodiment, the main storage capacitor Cst may not overlap the main thin film transistor TFT, and the first lower electrode 144a may be an element separate from (or defined independently of) the first gate electrode 136a of the main thin film transistor TFT. The auxiliary storage capacitor Cst' may include a second lower electrode 144b and a second upper electrode 146b. The auxiliary storage capacitor Cst' may overlap the auxiliary thin film transistor TFT', and the second lower electrode 144b of the auxiliary storage capacitor Cst' may be integrally provided with the second gate electrode 136b of the auxiliary thin film transistor TFT' as a single unitary unit. In an alternative embodiment, the auxiliary storage capacitor Cst' may not overlap the auxiliary thin film transistor TFT', and the second lower electrode 144b may be an element separate from (or defined independently of) the second gate electrode 136b of the auxiliary thin film transistor TFT'.

The first upper electrode 146a and the second upper electrode 146b may each include at least one material selected from, for example, aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single-layered or multi-layered structure including the above stated materials.

The interlayer insulating layer 107 may cover the first upper electrode 146a and the second upper electrode 146b. The interlayer insulating layer 107 may include at least one material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) and zinc oxide ($ZnO_2$), for example.

The first and second source electrodes 137a and 137b and the first and second drain electrodes 138a and 138b may be on the interlayer insulating layer 107. The first and second source electrodes 137a and 137b and the first and second drain electrodes 138*a* and 138*b* may include a conductive material including at least one selected from molybdenum (Mo), aluminum (Al), copper (Cu) and titanium (Ti), for example, and may have a single-layered or multi-layered structure including the above stated materials. In one embodiment, for example, the first and second source electrodes 137*a* and 137*b* and the first and second drain electrodes 138*a* and 138*b* may each have a multi-layered structure including Ti/Al/Ti.

A planarization layer 113 may cover the first and second source electrodes 137*a* and 137*b* and the first and second drain electrodes 138*a* and 138*b*. The planarization layer 113 may have a flat upper surface so that the pixel electrode that is arranged thereon may be stably disposed.

The planarization layer 113 may have a single-layered or multi-layered structure including an organic material or an inorganic material. In an embodiment, the planarization layer 113 may include at least one material selected from a general universal polymer (e.g., benzocyclobutene ("BCB"), polyimide, hexamethyldisiloxane ("HMDSO"), polymethylmethacrylate ("PMMA"), or polystyrene ("PS")), polymer derivatives having phenol groups, acryl-based polymer, imide-based polymer, aryl ether-based polymer, amide-based polymer, fluoride-based polymer, p-xylene-based polymer, vinyl alcohol-based polymer, and a combination (e.g., a blend) thereof. In an embodiment, the planarization layer 113 may include at least one selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) and zinc oxide ($ZnO_2$), for example. After arranging the planarization layer 113, a chemical and mechanical polishing may be performed to provide a flat upper surface.

An opening is defined through the planarization layer 113 to expose one of the first source electrode 137*a* and the first drain electrode 138*a* of the main thin film transistor TFT, and the first pixel electrode 210*a* may contact the first source electrode 137*a* or the first drain electrode 138*a* via the opening to be electrically connected to the main thin film transistor TFT.

In an embodiment, an opening the planarization layer 113 include to expose one of the second source electrode 137*b* and the second drain electrode 138*b* of the auxiliary thin film transistor TFT', and the second pixel electrode 210*b* may contact the second source electrode 137*b* or the second drain electrode 138*b* via the opening to be electrically connected to the auxiliary thin film transistor TFT'.

In the first area 1A of the substrate 100, the main organic light-emitting diode OLED including the first pixel electrode 210*a*, the first intermediate layer 220*a*, and the first opposite electrode 230*a* facing the first pixel electrode 210*a* with the first intermediate layer 220*a* therebetween may be on the planarization layer 113.

In the second area 2A of the substrate 100, the auxiliary organic light-emitting diode OLED' including the second pixel electrode 210*b*, the second intermediate layer 220*b*, and the second opposite electrode 230*b* facing the second pixel electrode 210*b* with the second intermediate layer 220*b* therebetween may be on the planarization layer 113.

The first pixel electrode 210*a* and the second pixel electrode 210*b* may be on the planarization layer 113. The first pixel electrode 210*a* and the second pixel electrode 210*b* may be (semi-)transmissive electrodes or reflective electrodes. The first and second pixel electrodes 210*a* and 210*b* may include a reflective layer including at least one selected from Ag, Mg, Al, Pt, Pd, Au, Ni, Nd, Ir, Cr, and a compound thereof, and a transparent or semi-transparent electrode layer on the reflective layer. The transparent or semi-transparent electrode layer may include at least one material selected from indium tin oxide ("ITO"), indium zinc oxide ("IZO"), zinc oxide (ZnO), indium oxide ($In_2O_3$), indium gallium oxide, and aluminum zinc oxide ("AZO"). The first and second pixel electrodes 210*a* and 210*b* may each have a structure of ITO/Ag/ITO.

The pixel defining layer 180 may be on the planarization layer 113, and an opening is defined through the pixel defining layer 180 to at least partially expose the first pixel electrode 210*a* and at least partially exposes the second pixel electrode 210*b*. The pixel defining layer 180 increases a distance between the edge of the first pixel electrode 210*a* and the first opposite electrode 230*a* over the first pixel electrode 210*a* to prevent generation of arc at the edge of the first pixel electrode 210*a*, and also increases a distance between an edge of the second pixel electrode 210*b* and the second opposite electrode 230*b* over the second pixel electrode 210*b* to prevent generation of arc at the edge of the second pixel electrode 210*b*. The pixel defining layer 180 may include, for example, an organic insulating material such as polyimide, polyamide, an acrylic resin, benzocyclobutene, hexamethyldisiloxane ("HMDSO"), and a phenol resin, and may be obtained by a spin coating, etc.

The first intermediate layer 220*a* may be on the first pixel electrode 210, at least a part of which is exposed due to the pixel defining layer 180, and the second intermediate layer 220*b* may be on the second pixel electrode 210*b*. The first and second intermediate layers 220*a* and 220*b* may include an emission layer, and functional layers such as a hole transport layer ("HTL"), a hole injection layer ("HIL"), an electron transport layer ("ETL"), and an electron injection layer ("EIL") may be selectively arranged under and on the emission layer.

The emission layer may include an organic material including a fluorescent or phosphor material that emits red light, green light, blue light, or white light. The emission layer may include low-molecular weight organic materials or polymer organic materials. In one embodiment, for example, the emission layer included in the first intermediate layer 220*a* and the second intermediate layer 220*b* may include a material that emits green light.

In an embodiment, where the emission layer includes a low-molecular weight organic material, the first and second intermediate layers 220*a* and 220*b* may each include a HIL, a HTL, an emission layer ("EML"), an ETL, and an EIL in a single or multiple-layered structure. In such an embodiment, the low-molecular weight organic material may include at least one selected from copper phthalocyanine ("CuPc"), N,N'-Di(naphthalene-1-yl)-N,N'-diphenyl-benzidine ("NPB"), and tris-8-hydroxyquinoline aluminum ("$Alq_3$"). The above layers may be manufactured by a vacuum deposition method.

In an embodiment, where the emission layer includes a polymer organic material, the first and second intermediate layers 220*a* and 220*b* may each have a structure including a HTL and an EML. In such an embodiment, the HTL may include PEDOT, and the EML may include a poly-phenylenevinylene ("PPV")-based or polyfluorene-based polymer material. The light-emitting layer may be arranged by using a screen printing method, an inkjet printing method, a laser induced thermal imaging ("LITI") method, etc.

The first opposite electrode 230*a* may be on the first intermediate layer 220*a*. The first opposite electrode 230*a* is on the first intermediate layer 220*a* to entirely cover the first intermediate layer 220*a*. The first opposite electrode 230*a* is on the first area 1A to entirely cover the first area 1A. In an embodiment, the first opposite electrode 230a may be integrally provided as a single unitary unit to cover the plurality of main pixels Pm in the first area 1A.

The second opposite electrode 230b may be on the second intermediate layer 220b. The second opposite electrode 230b is on the second intermediate layer 220b to entirely cover the second intermediate layer 220b. The second opposite electrode 230b is on the second area 2A to entirely cover the second area 2A. In an embodiment, the second opposite electrode 230b is integrally provided as a single unitary unit to cover the plurality of auxiliary pixels Pa in the second area 2A and may be on the transmission area TA in the second area 2A.

In an embodiment, the first opposite electrode 230a and the second opposite electrode 230b may be integrated with each other or integrally provided with each other as a single unitary unit. In one embodiment, for example, the first opposite electrode 230a on the first area 1A may extend towards the second area 2A to be on the second area 2A.

The first opposite electrode 230a and the second opposite electrode 230b may include a conductive material have a low work function. In one embodiment, for example, the first opposite electrode 230a and the second opposite electrode 230b may include a (semi-)transparent layer including at least one selected from argentum (Ag), magnesium (Mg), aluminum (Al), platinum (Pt), palladium (Pd), aurum (Au), nickel (Ni), neodymium (Nd), iridium (Ir), chrome (Cr), lithium (Li), calcium (Ca), and a combination (e.g., an alloy) thereof. Alternatively, the first opposite electrode 230a and the second opposite electrode 230b may further include a layer including ITO, IZO, ZnO, or $In_2O_3$ on the (semi-)transparent layer including the above-listed material.

A first conductive layer 108 may be on the second gate insulating layer 105 of the second area 2A and a second conductive layer 109 may be on the interlayer insulating layer 107. The first conductive layer 108 and the second conductive layer 109 may each define at least one selected from the scan line, the light-emission control line, the data line, and the driving voltage line stated above. The first conductive layer 108 and the second conductive layer 109 may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu).

The metal pattern layer 111 may be on the interlayer insulating layer 107 of the second area 2A. The metal pattern layer 111 may be in (or directly on) a same layer as the second conductive layer 109 and may include a same material as the second conductive layer 109. In an embodiment, the metal pattern layer 111 may be integrally provided with the second conductive layer 109 as a single unitary unit. In one embodiment, for example, the metal pattern layer 111 may be an extension of the second conductive layer 109 towards the transmission area TA.

The metal pattern layer 111 surrounds the transmission area TA of the second area 2A, and thus may prevent or reduce diffraction of the light emitted from the component 20 under the second area 2A while passing through the transmission area TA.

Figure 7B:
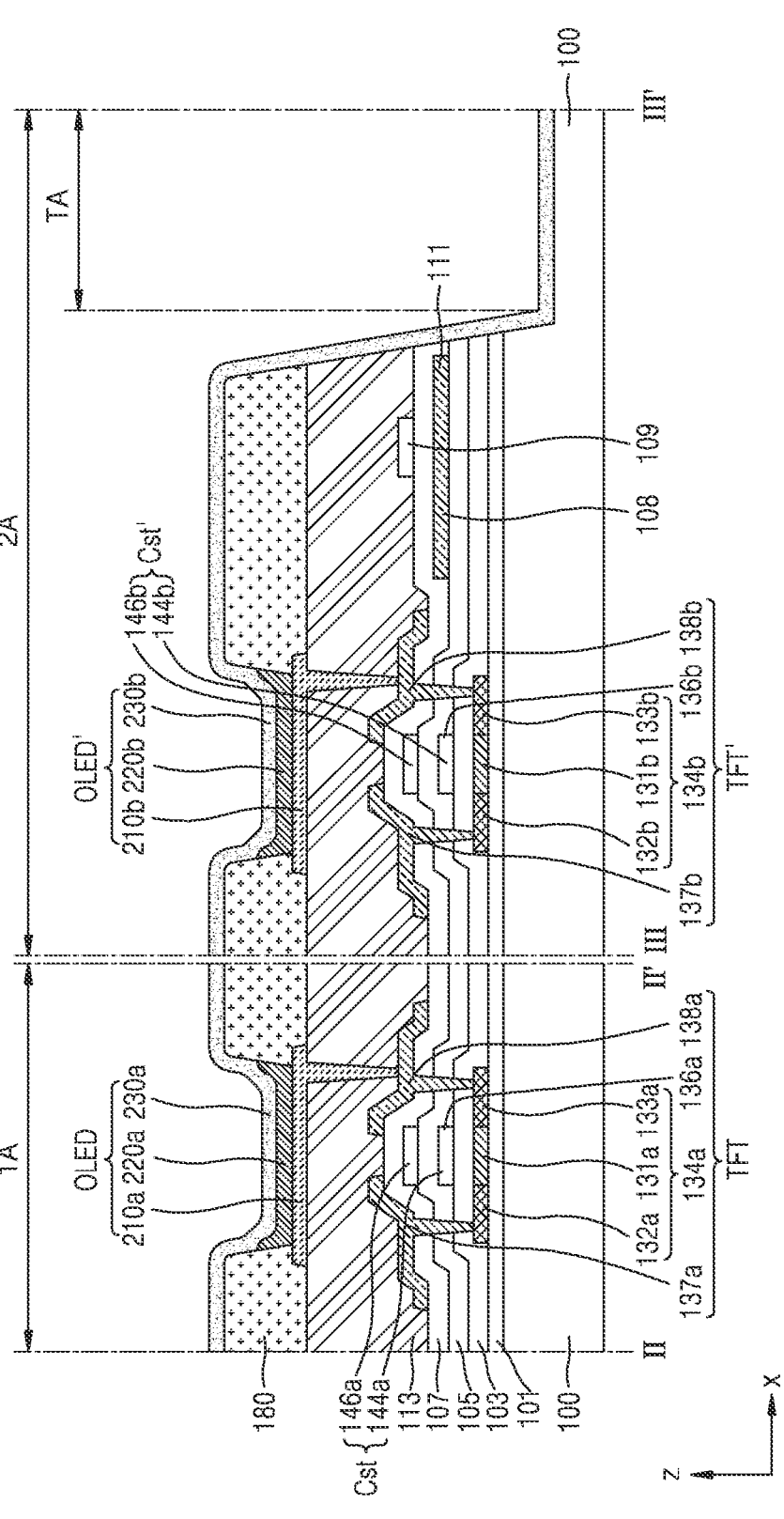

The embodiment illustrated in FIG. 7B is substantially the same as the embodiment described above with reference to FIG. 7A, except that the metal pattern layer 111 is integrally provided with the first conductive layer 108 as a single unitary unit. The same or like elements shown in FIG. 7B have been labeled with the same reference characters as used above to describe the embodiment shown in FIG. 7A, and any repetitive detailed description thereof will hereinafter be omitted or simplified.

Referring to FIG. 7B, in an alternative embodiment, the first conductive layer 108 may be on the second gate insulating layer 105 of the second area 2A and the second conductive layer 109 may be on the interlayer insulating layer 107. The first conductive layer 108 and the second conductive layer 109 may each define at least one selected from the scan line, the light-emission control line, the data line, and the driving voltage line stated above. The first conductive layer 108 and the second conductive layer 109 may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu).

The metal pattern layer 111 may be on the second gate insulating layer 105 of the second area 2A. The metal pattern layer 111 may be in (or directly on) a same layer as the first conductive layer 108 and may include a same material as that of the first conductive layer 108. In an embodiment, the metal pattern layer 111 may be integrally provided with the first conductive layer 108 as a single unitary unit. In one embodiment, for example, the metal pattern layer 111 may be an extension of the first conductive layer 108 towards the transmission area TA.

The metal pattern layer 111 surrounds the transmission area TA of the second area 2A, and thus may prevent or reduce diffraction of the light emitted from the component 20 under the second area 2A while passing through the transmission area TA.

Figure 7C:
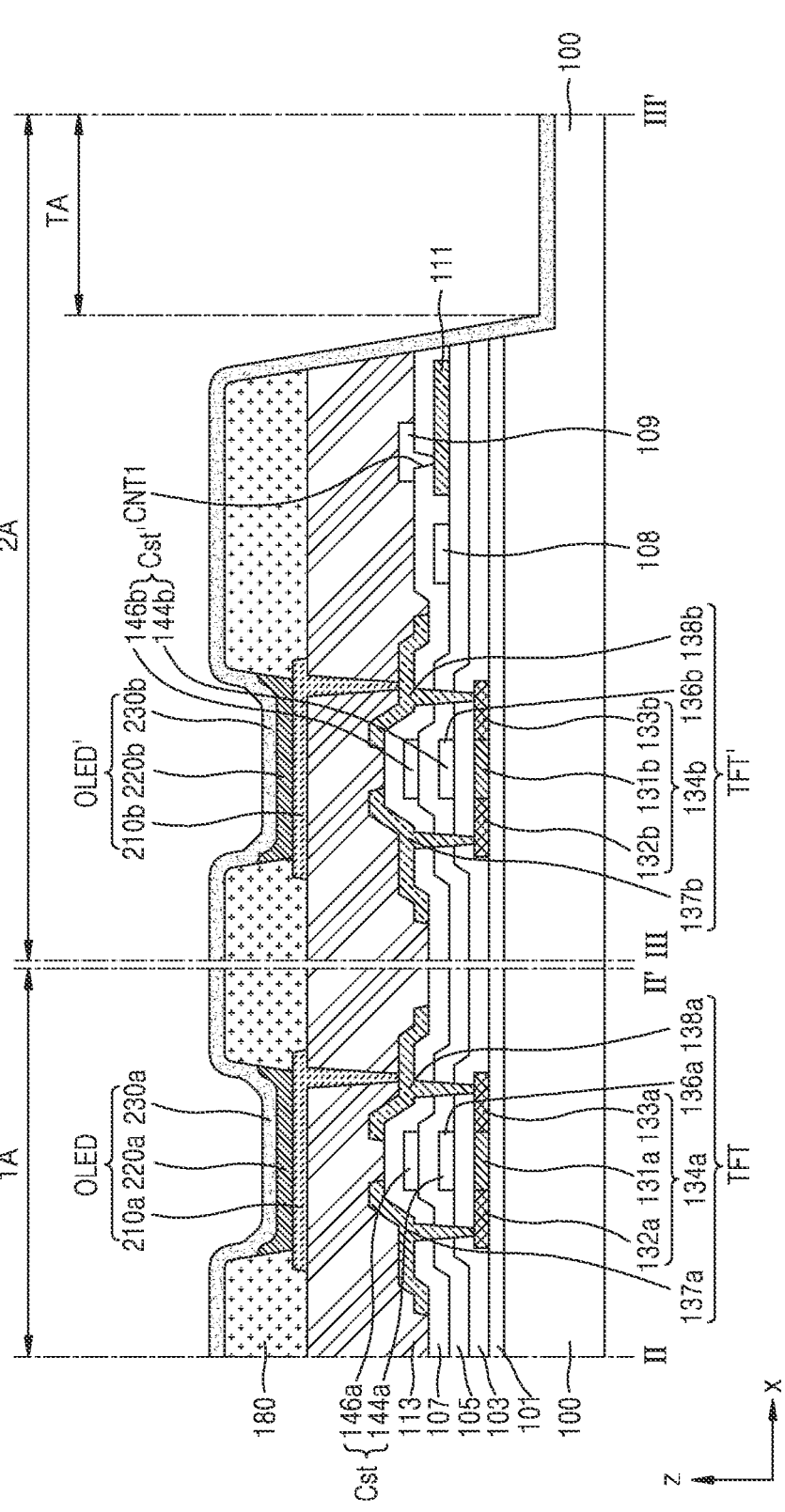

The embodiment illustrated in FIG. 7C is substantially the same as the embodiment described above with reference to FIG. 7A, except that the metal pattern layer 111 is spaced apart from the first conductive layer 108 and is electrically connected to the second conductive layer 109 via a first contact hole CNT1. The same or like elements shown in FIG. 7C have been labeled with the same reference characters as used above to describe the embodiment shown in FIG. 7A, and any repetitive detailed description thereof will hereinafter be omitted or simplified.

Referring to FIG. 7C, in another alternative embodiment, the first conductive layer 108 may be on the second gate insulating layer 105 of the second area 2A and the second conductive layer 109 may be on the interlayer insulating layer 107. The first conductive layer 108 and the second conductive layer 109 may each include at least one selected from the scan line, the light-emission control line, the data line, and the driving voltage line stated above. The first conductive layer 108 and the second conductive layer 109 may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu).

The metal pattern layer 111 may be on the second gate insulating layer 105 of the second area 2A. The metal pattern layer 111 may be in (or directly on) a same layer as the first conductive layer 108 and may include a same material as the first conductive layer 108. The metal pattern layer 111 may be spaced apart from the first conductive layer 108. The metal pattern layer 111 surrounds the transmission area TA of the second area 2A, and thus may prevent or reduce diffraction of the light emitted from the component 20 under the second area 2A while passing through the transmission area TA.

In an embodiment, the metal pattern layer 111 may be electrically connected to the second conductive layer 109 via the first contact hole CNT1 defined in the interlayer insulating layer 107. In such an embodiment, since the metal pattern layer 111 is electrically connected to the second conductive layer 109 via the first contact hole CNT1 defined in the interlayer insulating layer 107, floating of the metal pattern layer 111 may be effectively prevented and coupling of the metal pattern layer 111 to neighboring lines may be effectively prevented.

Figure 7D:
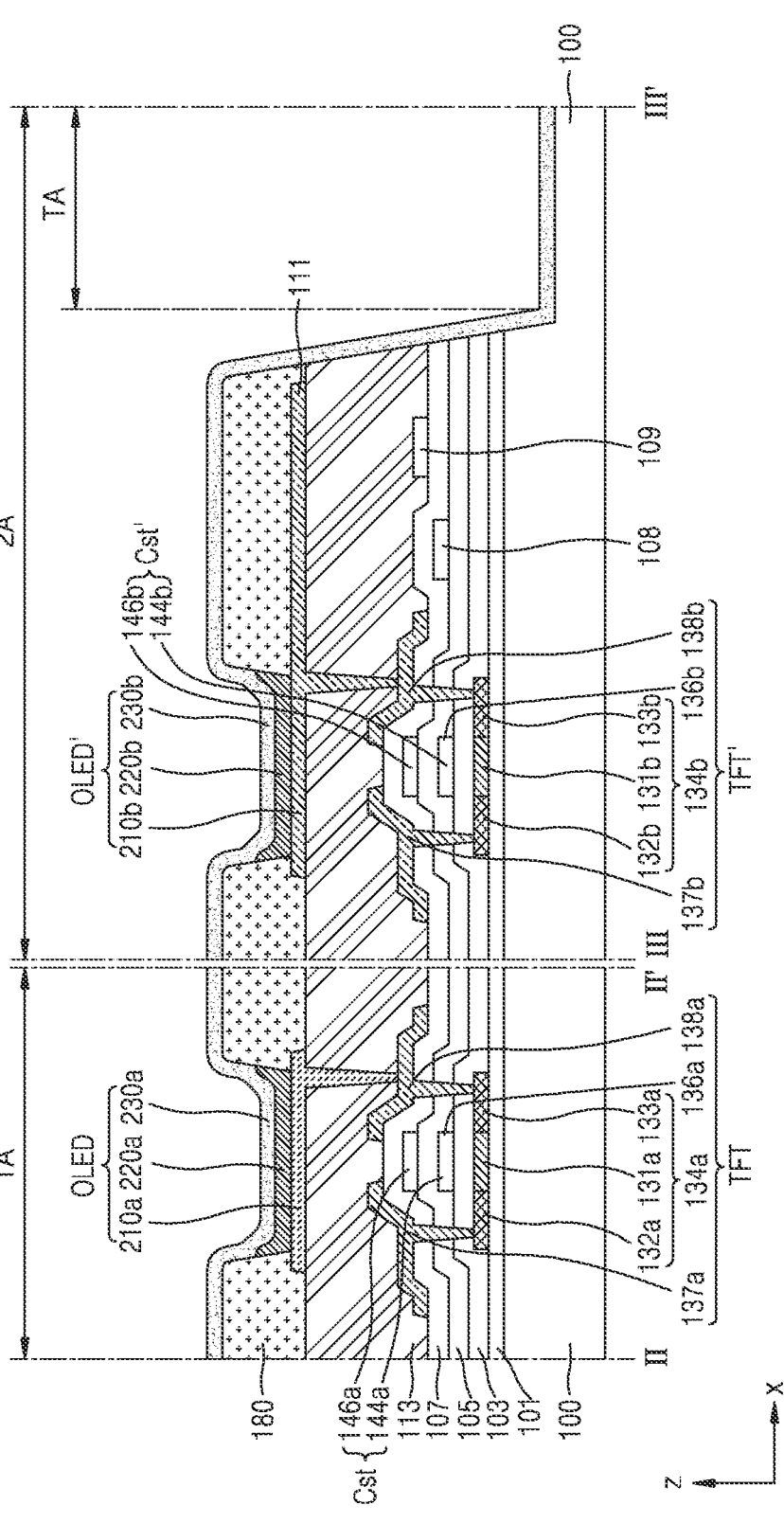

The embodiment illustrated in FIG. 7D is substantially the same as the embodiment described above with reference to FIG. 7A, except that the metal pattern layer 111 is integrally formed with the second pixel electrode 210b. The same or like elements shown in FIG. 7D have been labeled with the same reference characters as used above to describe the embodiment shown in FIG. 7A, and any repetitive detailed description thereof will hereinafter be omitted or simplified.

Referring to FIG. 7D, in another alternative embodiment, the first conductive layer 108 may be on the second gate insulating layer 105 of the second area 2A, the second conductive layer 109 may be on the interlayer insulating layer 107, the planarization layer 113 may be on the second conductive layer 109, and the second pixel electrode 210b may be on the planarization layer 113. The first conductive layer 108 and the second conductive layer 109 may each include at least one selected from the scan line, the light-emission control line, the data line, and the driving voltage line stated above. The first conductive layer 108 and the second conductive layer 109 may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu).

The metal pattern layer 111 may be on the planarization layer 113 in the second area 2A. The metal pattern layer 111 at least partially overlaps the first conductive layer 108 and the second conductive layer 109, and may be on the planarization layer 113. The metal pattern layer 111 may be in (or directly on) a same layer as the second pixel electrode 210b and may include a same material as the second pixel electrode 210b. In an embodiment, the metal pattern layer 111 may be integrally provided with the second pixel electrode 210b as a single unitary unit. In one embodiment, for example, the metal pattern layer 111 may be an extension of the second pixel electrode 210b towards the transmission area TA.

The metal pattern layer 111 surrounds the transmission area TA of the second area 2A, and thus may prevent or reduce diffraction of the light emitted from the component 20 under the second area 2A while passing through the transmission area TA.

Figure 8A:
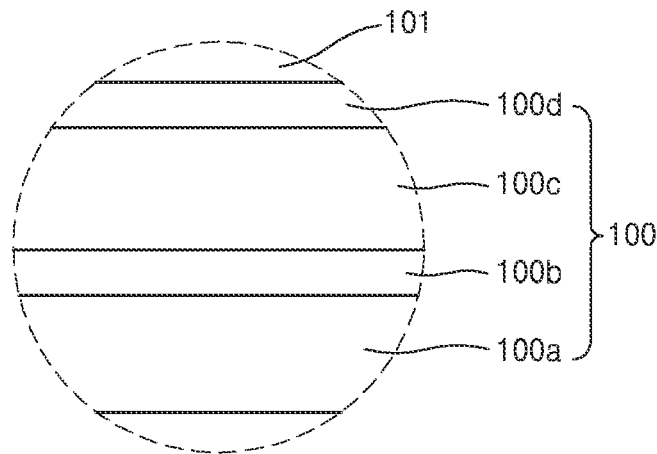
FIGS. 8A to 8B are cross-sectional views of a display apparatus according to an embodiment.
Figure 8B:
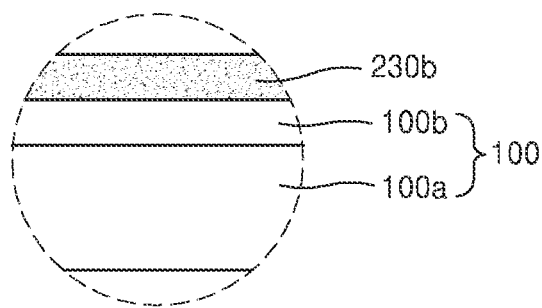

FIGS. 8A and 8B are cross-sectional views of a display apparatus according to an embodiment.

More particularly, FIG. 8A illustrates the substrate 100 on the first area 1A and the second area 2A except for the transmission area TA, and shows an enlarged view of a portion B of FIG. 7A, and FIG. 8B illustrates the substrate 100 corresponding to the transmission area TA and shows an enlarged view of a portion C in FIG. 7A.

Referring to FIGS. 8A and 8B, the substrate 100 on the first area 1A and on the second area 2A except for the transmission area TA may include a first substrate 100a, a first barrier layer 100b on the first substrate 100a, a second substrate 100c on the first barrier layer 100b, and a second barrier layer 100d on the second substrate 100c. The substrate 100 corresponding to the transmission area TA may include the first substrate 100a and the first barrier layer 100b on the first substrate 100a. In such an embodiment, the substrate 100 corresponding to the transmission area TA does not include the second substrate 100c and the second barrier layer 100d on the second substrate 100c, such that the transmittance of the transmission area TA may be improved.

The first substrate 100a and the second substrate 100c may include polyimide. The first barrier layer 100b is between the first substrate 100a and the buffer layer 101 to prevent infiltration of external air, and the second barrier layer 100d is between the second substrate 100c and the buffer layer 101 to prevent infiltration of external air.

Figure 9:
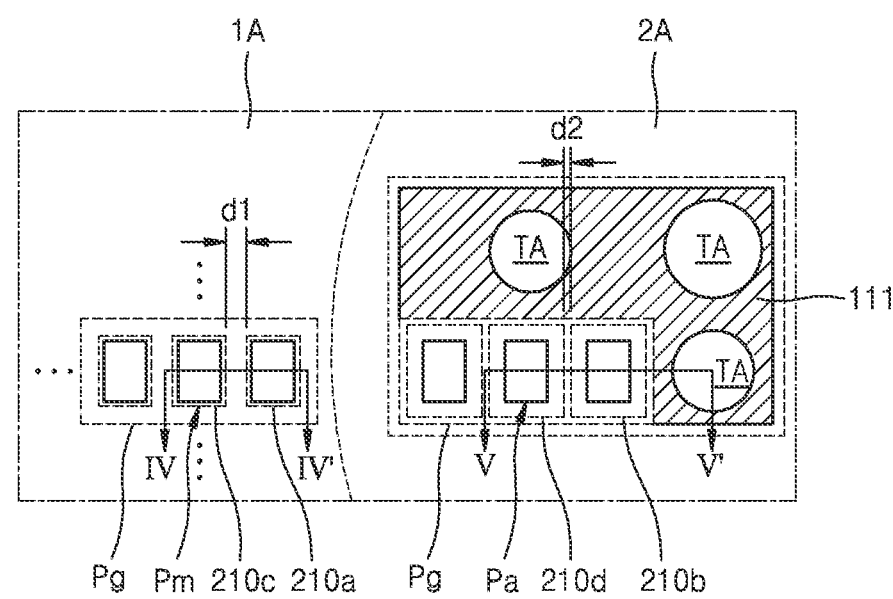
FIG. 9 is an enlarged view of portion A in FIG. 3.
Figure 9:
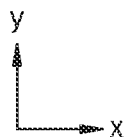

FIG. 9 is an enlarged view of portion A in FIG. 3.

The embodiment illustrated is FIG. 9 is substantially the same as the embodiment described above with reference to FIG. 6, except that pixel electrodes on the second area 2A are widely arranged. The same or like elements shown in FIG. 9 have been labeled with the same reference characters as used above to describe the embodiment shown in FIG. 6, and any repetitive detailed description thereof will hereinafter be omitted or simplified.

As described later with reference to FIGS. 10A to 10D, an interlayer insulating layer 107, a planarization layer 113, a pixel defining layer 180, a second opposite electrode 230b, etc. may be on a metal pattern layer 111 of FIG. 9, but the above layers are omitted in FIG. 9 for convenience of illustration and description.

In an embodiment, the second pixel electrode 210b and a fourth pixel electrode 210d on the second area 2A may be wider than the first pixel electrode 210a and a third pixel electrode 210c on the first area 1A. In such an embodiment, the second and fourth pixel electrodes 210b and 210d on the second area 2A are wider than the first and third pixel electrodes 210a and 210c on the first area 1A, and thus, a first distance d1 that is defined as a shortest distance from the first pixel electrode 210a to the third pixel electrode 210c may be greater than a second distance d2 that is defined as a shortest distance from the second pixel electrode 210b to the fourth pixel electrode 210d.

In such an embodiment, where the second and fourth pixel electrodes 210b and 210d on the second area 2A are wider than the first and third pixel electrodes 210a and 210c on the first area 1A, light emitted from the component 20 under the second area 2A may be effectively prevented from passing between the auxiliary pixels Pa and the lines.

FIGS. 10A to 10D are cross-sectional views of a display apparatus according to an embodiment. More particularly, FIGS. 10A to 10D are cross-sectional views of the first area 1A and the second area 2A taken along line IV-IV' and V-V' of FIG. 9.

Figure 10A:
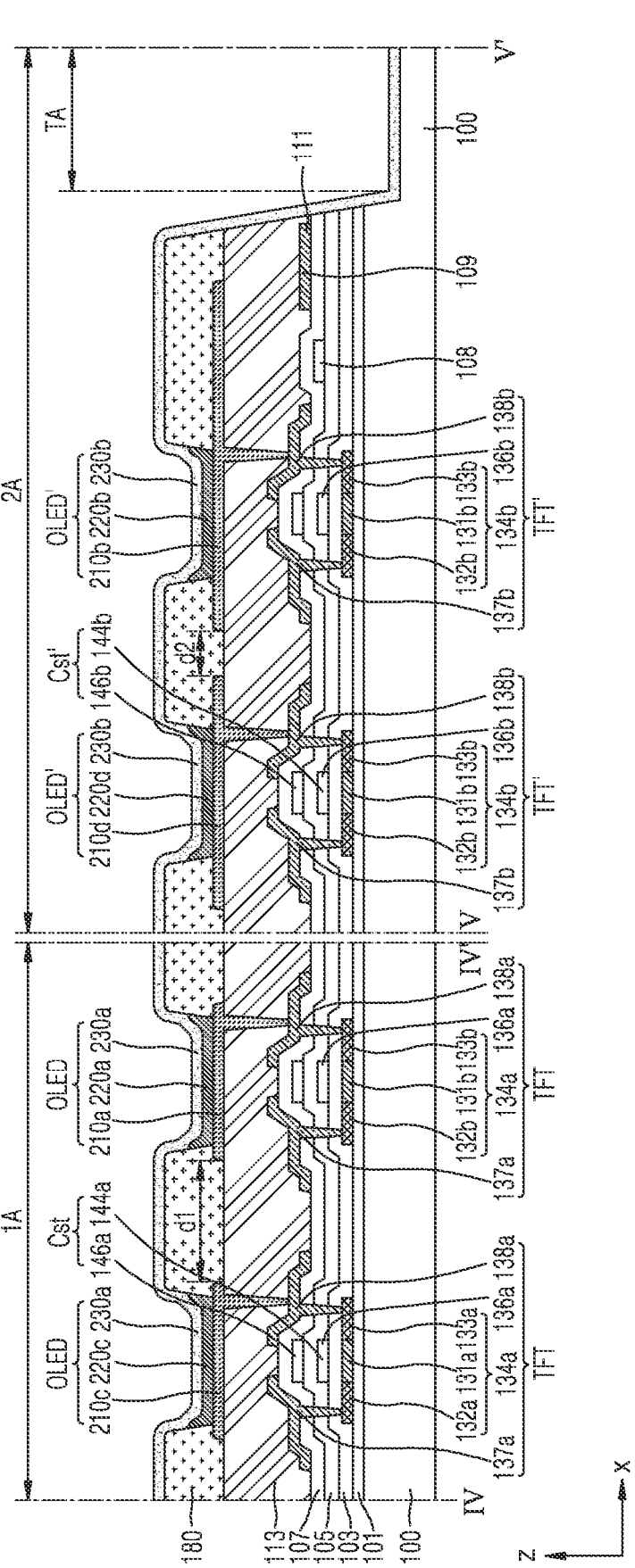
FIGS. 10A to 10D are cross-sectional views of a display apparatus according to an embodiment.

The embodiment illustrated is FIG. 10A is substantially the same as the embodiment described above with reference to FIG. 7A, except that the second and fourth pixel electrodes 210b and 210d on the second area 2A are wider than the first and third pixel electrodes 210a and 210c on the first area 1A. The same or like elements shown in FIG. 10A have been labeled with the same reference characters as used above to describe the embodiment shown in FIG. 7A, and any repetitive detailed description thereof will hereinafter be omitted or simplified.

Referring to FIG. 10A, in an embodiment, the third pixel electrode 210c may be on the first area 1A to be spaced apart from the first pixel electrode 210a, and the fourth pixel electrode 210d may be on the second area 2A to be spaced apart from the second pixel electrode 210b. The second intermediate layer 220b may be on the second pixel electrode 210b and the first opposite electrode 230a may be on the second intermediate layer 220b. The fourth intermediate layer 220d may be on the fourth pixel electrode 210d and the second opposite electrode 230b may be on the fourth intermediate layer 220d. The third intermediate layer 220c may be on the second pixel electrode 210c and the first opposite electrode 230a may be on the third intermediate layer 220c. In an embodiment, the first opposite electrode 230a and the second opposite electrode 230b may be integrated with each other or integrally provided with each other as a single unitary unit.

The second pixel electrode 210b and a fourth pixel electrode 210d on the second area 2A may be wider than the first pixel electrode 210a and a third pixel electrode 210c on the first area 1A. In such an embodiment, the second and fourth pixel electrodes 210b and 210d on the second area 2A are wider than the first and third pixel electrodes 210a and 210c on the first area 1A, and thus, a first distance d1 that is defined as a shortest distance from the first pixel electrode 210a to the third pixel electrode 210c may be greater than a second distance d2 that is defined as a shortest distance from the second pixel electrode 210b to the fourth pixel electrode 210d. In an embodiment, the transmittance of the first area 1A may be greater than that of the second area 2A except for the transmission area TA.

In such an embodiment where the second and fourth pixel electrodes 210b and 210d are relatively wide on the second area 2A and block lower portions of the second and fourth pixel electrodes 210b and 210d, the transmittance of the second area 2A except for the transmission area TA may be reduced, and the light emitted from the component 20 under the second area 2A may be transmitted only through transmission area TA.

A first conductive layer 108 may be on the second gate insulating layer 105 of the second area 2A and a second conductive layer 109 may be on the interlayer insulating layer 107. The first conductive layer 108 and the second conductive layer 109 may each include at least one selected from the scan line, the light-emission control line, the data line, and the driving voltage line stated above. The first conductive layer 108 and the second conductive layer 109 may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu). The second pixel electrode 210b may at least partially overlap the first and second conductive layers 108 and 109.

The metal pattern layer 111 may be on the interlayer insulating layer 107 of the second area 2A. The metal pattern layer 111 may at least partially overlap the second pixel electrode 210b on the interlayer insulating layer 107 when viewed in a plan view in a thickness direction of the substrate 100 or the Z-axis direction. The metal pattern layer 111 may be in (or directly on) a same layer as the second conductive layer 109 and may include a same material as the second conductive layer 109. In an embodiment, the metal pattern layer 111 may be integrally provided with the second conductive layer 109 as a single unitary unit. In one embodiment, for example, the metal pattern layer 111 may be an extension of the second conductive layer 109 towards the transmission area TA.

The metal pattern layer 111 surrounds the transmission area TA of the second area 2A, and thus may prevent or reduce diffraction of the light emitted from the component 20 under the second area 2A while passing through the transmission area TA.

Figure 10B:
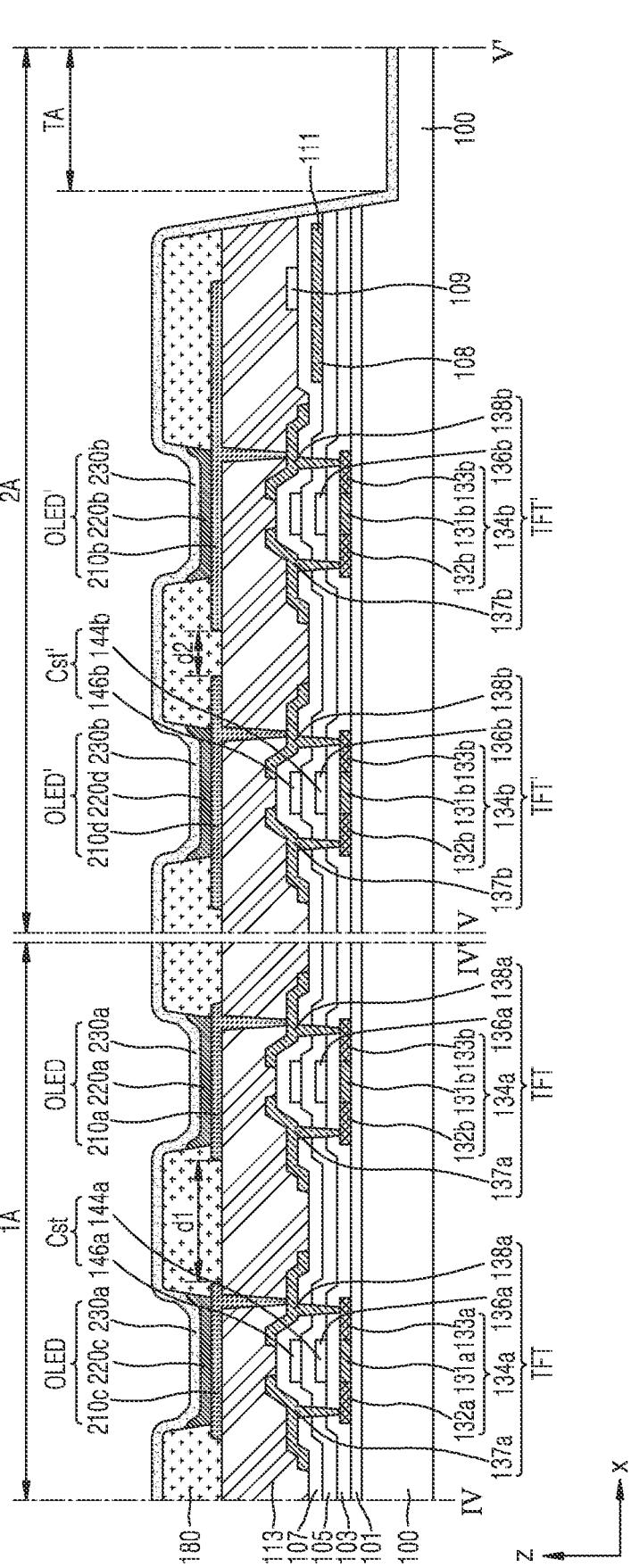

The embodiment illustrated in FIG. 10B is substantially the same as the embodiment described above with reference to FIG. 10A, except that the metal pattern layer 111 is integrally provided with the first conductive layer 108 as a single unitary unit. The same or like elements shown in FIG. 10A have been labeled with the same reference characters as used above to describe the embodiment shown in FIG. 10B, and any repetitive detailed description thereof will hereinafter be omitted or simplified.

Referring to FIG. 10B, in an alternative embodiment, the second pixel electrode 210b and a fourth pixel electrode 210d on the second area 2A may be wider than the first pixel electrode 210a and a third pixel electrode 210c on the first area 1A. In such an embodiment, the second and fourth pixel electrodes 210b and 210d on the second area 2A are wider than the first and third pixel electrodes 210a and 210c on the first area 1A, and thus, a first distance d1 that is defined as a shortest distance from the first pixel electrode 210a to the third pixel electrode 210c may be greater than a second distance d2 that is defined as a shortest distance from the second pixel electrode 210b to the fourth pixel electrode 210d. In an embodiment, the transmittance of the first area 1A may be greater than that of the second area 2A except for the transmission area TA.

In such an embodiment, where the second and fourth pixel electrodes 210b and 210d are relatively wide on the second area 2A and block lower portions of the second and fourth pixel electrodes 210b and 210d, the transmittance of the second area 2A except for the transmission area TA may be reduced, and the light emitted from the component 20 under the second area 2A may be transmitted only through the transmission area TA.

A first conductive layer 108 may be on the second gate insulating layer 105 of the second area 2A and a second conductive layer 109 may be on the interlayer insulating layer 107. The first conductive layer 108 and the second conductive layer 109 may each include at least one selected from the scan line, the light-emission control line, the data line, and the driving voltage line stated above. The first conductive layer 108 and the second conductive layer 109 may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu).

The metal pattern layer 111 may be on the second gate insulating layer 105 of the second area 2A. The metal pattern layer 111 may be in (or directly on) a same layer as the first conductive layer 108 and may include a same material as the first conductive layer 108. In an embodiment, the metal pattern layer 111 may be integrally provided with the first conductive layer 108 as a single unitary unit. In one embodiment, for example, the metal pattern layer 111 may be an extension of the first conductive layer 108 towards the transmission area TA.

The metal pattern layer 111 surrounds the transmission area TA of the second area 2A, and thus may prevent or reduce diffraction of the light emitted from the component 20 under the second area 2A while passing through the transmission area TA.

Figure 10C:
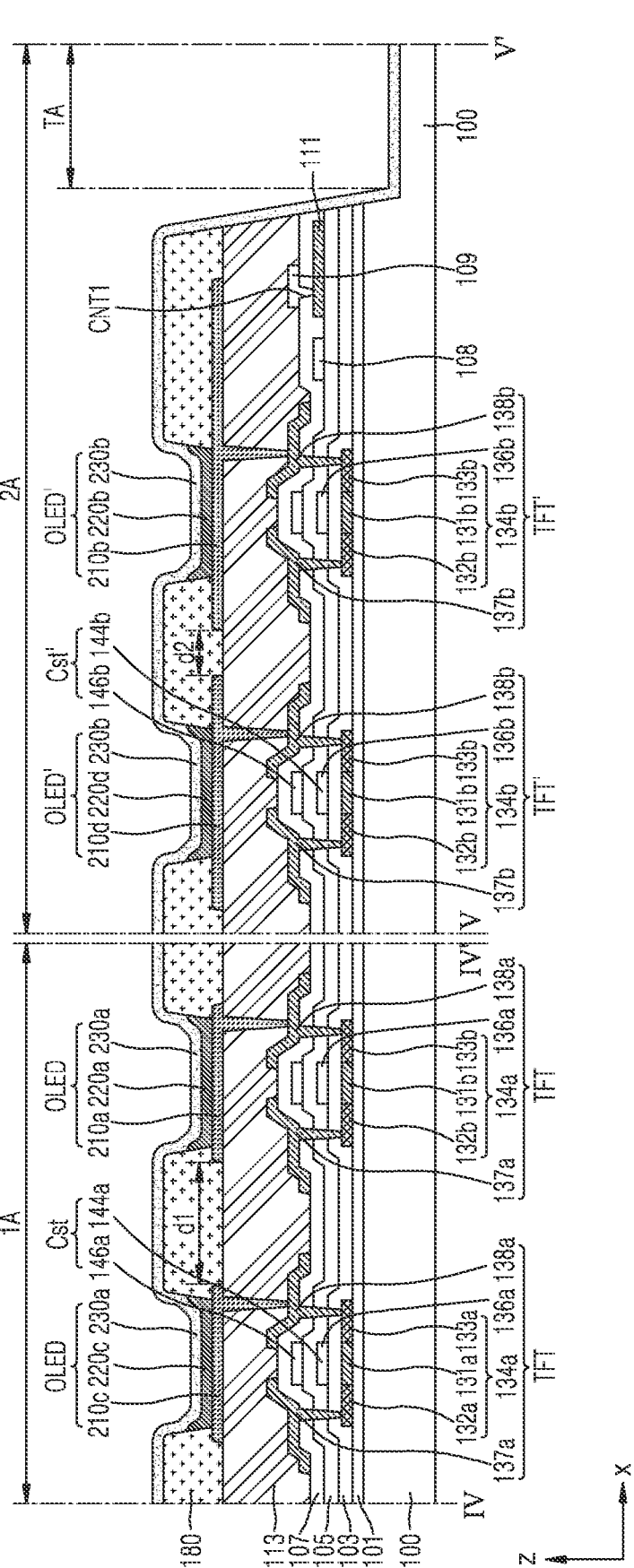

The embodiment illustrated in FIG. 10C is substantially the same as of the embodiment described above with reference to FIG. 10A, except that the metal pattern layer 111 is spaced apart from the first conductive layer 108 and is electrically connected to the second conductive layer 109 via a first contact hole CNT1. The same or like elements shown in FIG. 10C have been labeled with the same reference characters as used above to describe the embodiment shown in FIG. 10A, and any repetitive detailed description thereof will hereinafter be omitted or simplified.

Referring to FIG. 10C, in another alternative embodiment, the second pixel electrode 210b and a fourth pixel electrode 210d on the second area 2A may be wider than the first pixel electrode 210a and a third pixel electrode 210c on the first area 1A. In such an embodiment, the second and fourth pixel electrodes 210b and 210d on the second area 2A are wider than the first and third pixel electrodes 210a and 210c on the first area 1A, and thus, a first distance d1 that is defined as a shortest distance from the first pixel electrode 210a to the third pixel electrode 210c may be greater than a second distance d2 that is defined as a shortest distance from the second pixel electrode 210b to the fourth pixel electrode 210d. In an embodiment, the transmittance of the first area 1A may be greater than that of the second area 2A except for the transmission area TA.

In such an embodiment, where the second and fourth pixel electrodes 210b and 210d are relatively wide on the second area 2A and block lower portions of the second and fourth pixel electrodes 210b and 210d, the transmittance of the second area 2A except for the transmission area TA may be reduced, and the light emitted from the component 20 under the second area 2A may be transmitted only through the transmission area TA.

A first conductive layer 108 may be on the second gate insulating layer 105 of the second area 2A and a second conductive layer 109 may be on the interlayer insulating layer 107. The first conductive layer 108 and the second conductive layer 109 may each include at least one selected from the scan line, the light-emission control line, the data line, and the driving voltage line stated above. The first conductive layer 108 and the second conductive layer 109 may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu).

The metal pattern layer 111 may be on the second gate insulating layer 105 of the second area 2A. The metal pattern layer 111 may be in (or directly on) a same layer as the first conductive layer 108 and may include a same material as the first conductive layer 108. The metal pattern layer 111 may be spaced apart from the first conductive layer 108. The metal pattern layer 111 surrounds the transmission area TA of the second area 2A, and thus may prevent or reduce diffraction of the light emitted from the component 20 under the second area 2A while passing through the transmission area TA.

In an embodiment, the metal pattern layer 111 may be electrically connected to the second conductive layer 109 via the first contact hole CNT1 defined in the interlayer insulating layer 107. In such an embodiment where the metal pattern layer 111 is electrically connected to the second conductive layer 109 via the first contact hole CNT1 defined in the interlayer insulating layer 107, floating of the metal pattern layer 111 may be effectively prevented and coupling of the metal pattern layer 111 to neighboring lines may be effectively prevented.

Figure 10D:
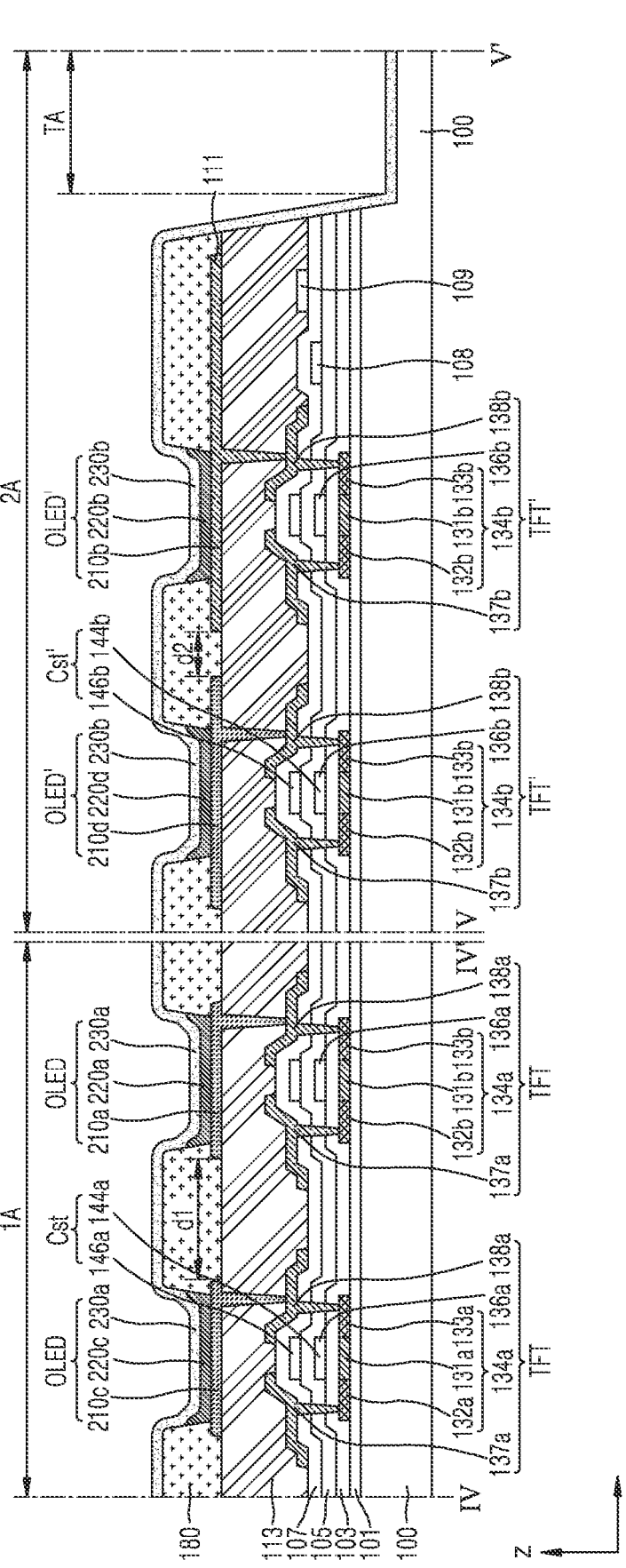

The embodiment illustrated with reference to FIG. 10D is substantially the same as the embodiment described above with reference to FIG. 10A, except that the metal pattern layer 111 is integrally formed with the second pixel electrode 210b as a single unitary unit. The same or like elements shown in FIG. 10D have been labeled with the same reference characters as used above to describe the embodiment shown in FIG. 10A, and any repetitive detailed description thereof will hereinafter be omitted or simplified.

Referring to FIG. 10D, the second pixel electrode 210b and a fourth pixel electrode 210d on the second area 2A may be wider than the first pixel electrode 210a and a third pixel electrode 210c on the first area 1A. In such an embodiment, the second and fourth pixel electrodes 210b and 210d on the second area 2A are wider than the first and third pixel electrodes 210a and 210c on the first area 1A, and thus, a first distance d1 that is defined as a shortest distance from the first pixel electrode 210a to the third pixel electrode 210c may be greater than a second distance d2 that is defined as a shortest distance from the second pixel electrode 210b to the fourth pixel electrode 210d. In an embodiment, the transmittance of the first area 1A may be greater than that of the second area 2A except for the transmission area TA.

In such an embodiment where the second and fourth pixel electrodes 210b and 210d are relatively wide on the second area 2A and block lower portions of the second and fourth pixel electrodes 210b and 210d, the transmittance of the second area 2A except for the transmission area TA may be reduced, and the light emitted from the component 20 under the second area 2A may be transmitted only through the transmission area TA.

The first conductive layer 108 may be on the second gate insulating layer 105 of the second area 2A, the second conductive layer 109 may be on the interlayer insulating layer 107, the planarization layer 113 may be on the second conductive layer 109, and the second pixel electrode 210b may be on the planarization layer 113. The first conductive layer 108 and the second conductive layer 109 may each include at least one selected from the scan line, the light-emission control line, the data line, and the driving voltage line stated above. The first conductive layer 108 and the second conductive layer 109 may have a single or multi-layered structure including at least one metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu).

The metal pattern layer 111 may be on the planarization layer 113 in the second area 2A. The metal pattern layer 111 at least partially overlaps the first conductive layer 108 and the second conductive layer 109, and may be on the planarization layer 113. The metal pattern layer 111 may be in (or directly on) a same layer as the second pixel electrode 210b and may include a same material as the second pixel electrode 210b. In an embodiment, the metal pattern layer 111 may be integrally provided with the second pixel electrode 210b as a single unitary unit. In one embodiment, for example, the metal pattern layer 111 may be an extension of the second pixel electrode 210b towards the transmission area TA. The metal pattern layer 111 surrounds the transmission area TA of the second area 2A, and thus may prevent or reduce diffraction of the light emitted from the component 20 under the second area 2A while passing through the transmission area TA.

In a conventional display apparatus including an area in which the component 20 is arranged, a metal pattern may be between the substrate and the buffer layer to prevent the external light from reaching the auxiliary pixel Pa including the auxiliary thin film transistor TFT', etc. and to prevent the light generated from the component 20 from diffracting while passing through the transmission area TA.

However, in such a conventional display apparatus where the metal pattern is between the substrate and the buffer layer, a process and a mask for patterning the metal pattern and a process and a mask for forming a contact hole for applying a voltage to the metal pattern are additionally performed, and the number of processes and masks for manufacturing the display apparatus increases.

In embodiments of the invention, the metal pattern layer 111 for preventing diffraction of the light generated from the component 20 may be manufactured by using existing signal lines, without using additional process and masks.

In an embodiment of the invention, the second conductive layer 109 may be arranged on the interlayer insulating layer 107, such that the metal pattern layer 111 is simultaneously arranged on the interlayer insulating layer 107, and thus, the metal pattern for preventing the diffraction of the light generated from the component 20 may be obtained without using additional processes and masks. In such embodiments, the pixel electrode may be wide on the second area 2A to reduce the transmittance of the second area 2A except for the transmission area TA.

In an embodiment of the invention, the first conductive layer 108 is arranged on the second gate insulating layer 105, such that the metal pattern layer 111 is simultaneously arranged on the second gate insulating layer 105, and thus, the metal pattern for preventing diffraction of the light generated from the component 20 may be obtained without using additional processes and masks.

In an embodiment of the invention, the pixel electrode is arranged on the planarization layer 113 of the second area 2A, such that the metal pattern layer 111 is simultaneously arranged on the planarization layer 113, and thus, the metal pattern for preventing diffraction of the light generated from the component 20 may be obtained without using additional processes and masks.

According to embodiments of the invention, to address an issue of a conventional display apparatus where additional process and mask are used to form the metal pattern for preventing diffraction of light in the area on which the component is arranged, the metal pattern layer may be obtained by using existing signal lines without using additional process and mask and at the same time, reliability of the display apparatus may be improved.

According to one or more embodiments, the display apparatus having an expanded display area to display images even on an area in which components are arranged may be implemented. However, the scope of the disclosure is not limited to the above effects.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
   a substrate comprising a first area and a second area, wherein the second area includes a plurality of transmission areas;
   a first semiconductor layer on the first area;
   a first gate electrode on the first semiconductor layer;
   a first source electrode and a first drain electrode on the first gate electrode; and
   a metal pattern layer on the second area,
   wherein the plurality of transmission areas are defined by the metal pattern layer, and the metal pattern layer that defines the plurality of transmission areas is integrally formed.

2. The display apparatus of claim 1, wherein the metal pattern layer is disposed on a same layer as the first source electrode and the first drain electrode.

3. The display apparatus of claim 1, further comprising:
   a second semiconductor layer on the second area;
   a second gate electrode on the second semiconductor layer; and
   a second source electrode and a second drain electrode on the second gate electrode.

4. The display apparatus of claim 1, further comprising:
   a first gate insulating layer between the first semiconductor layer and the first gate electrode;
   a first upper electrode on the first gate electrode;
   a second gate insulating layer between the first gate electrode and the first upper electrode; and
   an interlayer insulating layer between the first upper electrode and the first source electrode.

5. The display apparatus of claim 4, further comprising:
   a first conductive layer on the second gate insulating layer; and
   a second conductive layer on the interlayer insulating layer.

6. The display apparatus of claim 5, wherein the metal pattern layer is integrally provided with the second conductive layer as a single unitary unit.

7. The display apparatus of claim 5, wherein the second conductive layer comprises a driving voltage line.

8. The display apparatus of claim 5, wherein the metal pattern layer is integrally provided with the first conductive layer as a single unitary unit.

9. The display apparatus of claim 5, wherein the metal pattern layer and the first conductive layer are spaced apart from each other in a same layer.

10. The display apparatus of claim 9, wherein the metal pattern layer is electrically connected to the second conductive layer via a first contact hole defined in the interlayer insulating layer.

11. The display apparatus of claim 5, further comprising:
   main pixels on the first area, wherein each of the main pixels comprises a first pixel electrode, a first opposite electrode, and a first intermediate layer between the first pixel electrode and the first opposite electrode; and
   auxiliary pixels on the second area, wherein each of the auxiliary pixels comprises a second pixel electrode, a second opposite electrode, and a second intermediate layer between the second pixel electrode and the second opposite electrode.

12. The display apparatus of claim 11, wherein the metal pattern layer is integrally provided with the second pixel electrode as a single unitary unit.

13. The display apparatus of claim 11, wherein the metal pattern layer at least partially overlaps the first conductive layer and the second conductive layer.

14. The display apparatus of claim 11, further comprising:

a third pixel electrode on the first area and spaced apart from the first pixel electrode; and a fourth pixel electrode on the second area and spaced apart from the second pixel electrode.

15. The display apparatus of claim 14, wherein a first distance is defined as a shortest distance from the first pixel electrode to the third pixel electrode, a second distance is defined as a shortest distance from the second pixel electrode to the fourth pixel electrode, and the first distance is greater than the second distance.

16. The display apparatus of claim 1, wherein the plurality of transmission areas has a circular shape or an elliptical shape.

17. The display apparatus of claim 11, further comprising:

an optical device under the substrate and corresponding to the second area, wherein the optical device overlaps with auxiliary pixels.

18. The display apparatus of claim 1, wherein the plurality of transmission areas are regions overlapping the substrate and corresponding to openings in the metal pattern layer.

* * * * *